(12) United States Patent
Barnett et al.

(10) Patent No.: US 11,313,981 B2
(45) Date of Patent: Apr. 26, 2022

(54) X-RAY AND γ-RAY PHOTODIODE

(71) Applicant: The University of Sussex, Brighton (GB)

(72) Inventors: Anna Megan Barnett, Brighton (GB); Silvia Butera, Brighton (GB)

(73) Assignee: The University of Sussex, Brighton (GB)

( * ) Notice: Subject to any disclaimer, the term of this patent is extended or adjusted under 35 U.S.C. 154(b) by 191 days.

(21) Appl. No.: 16/489,425

(22) PCT Filed: Feb. 28, 2018

(86) PCT No.: PCT/GB2018/050515
§ 371 (c)(1),
(2) Date: Aug. 28, 2019

(87) PCT Pub. No.: WO2018/158569
PCT Pub. Date: Sep. 7, 2018

(65) Prior Publication Data
US 2020/0012001 A1 Jan. 9, 2020

(30) Foreign Application Priority Data
Feb. 28, 2017 (GB) ...................... 1703196

(51) Int. Cl.
*G01T 1/24* (2006.01)
*G21H 1/12* (2006.01)
(Continued)

(52) U.S. Cl.
CPC .............. *G01T 1/244* (2013.01); *G01T 1/247* (2013.01); *G21H 1/12* (2013.01); *H01L 31/0203* (2013.01);
(Continued)

(58) Field of Classification Search
CPC ........... G01T 1/244; G01T 1/247; G21H 1/12; H01L 31/0203; H01L 31/022408; H01L 31/03046; H01L 31/035281; H01L 31/115
See application file for complete search history.

(56) References Cited

U.S. PATENT DOCUMENTS 4,445,130 A * 4/1984 Poulain ............... H01L 31/1105
257/187
4,541,003 A * 9/1985 Otsuka .................... H01L 21/26
174/350

(Continued)

FOREIGN PATENT DOCUMENTS

DE 102012214690 2/2014
JP 2011077293 4/2011

(Continued)

OTHER PUBLICATIONS

Dong et al., Solar Ceils with InGaN / GaN and InP / InGaAsP and InGaP /GaAs Multiple Quantum Wells, Solar Cells—New Approaches and Reviews, Oct. 22, 2015, pp. 333-358, Foshan University, Foshan, China.

*Primary Examiner* — David P Porta
*Assistant Examiner* — Jeremy S Valentiner
(74) *Attorney, Agent, or Firm* — Diederiks & Whitelaw, PLC.

(57) ABSTRACT

A photodiode for use in detecting X-rays and/or gamma rays is disclosed. The photodiode comprises InGaP arranged and configured to absorb X-rays and/or gamma-rays incident on the photodiode and generate charge-carriers in response thereto. The detector may be provided in an X-ray or gamma-ray photon counting spectrometer.

19 Claims, 13 Drawing Sheets

(51) Int. Cl.
*H01L 31/0203* (2014.01)
*H01L 31/0224* (2006.01)
*H01L 31/0304* (2006.01)
*H01L 31/0352* (2006.01)
*H01L 31/115* (2006.01)

(52) U.S. Cl.
CPC ........... *H01L 31/022408* (2013.01); *H01L 31/03046* (2013.01); *H01L 31/035281* (2013.01); *H01L 31/115* (2013.01)

(56) References Cited

U.S. PATENT DOCUMENTS

| | | | | |
|---|---|---|---|---|
| 5,939,733 | A * | 8/1999 | Sato | ........... H01L 31/03046 257/94 |
| 5,944,913 | A * | 8/1999 | Hou | ........... H01L 31/03042 136/255 |
| 8,476,598 | B1 | 7/2013 | Pralle et al. | |
| 8,674,316 | B1 * | 3/2014 | Pralle | ........... H01L 27/14658 250/370.09 |
| 2008/0157254 | A1 | 7/2008 | Kang | |
| 2011/0163237 | A1 * | 7/2011 | Akers | ........... G01T 1/208 250/362 |
| 2012/0049079 | A1 | 3/2012 | Yanoff et al. | |
| 2015/0207012 | A1 * | 7/2015 | Rogers | ........... H01L 31/1892 136/255 |
| 2015/0380592 | A1 * | 12/2015 | Newman | ........... H01L 31/043 136/255 |
| 2016/0116612 | A1 | 4/2016 | Lee et al. | |
| 2018/0158561 | A1 * | 6/2018 | Fenner | ........... A61N 1/378 |

FOREIGN PATENT DOCUMENTS

| | | |
|---|---|---|
| RU | 2014128555 | 2/2016 |
| WO | 2014/208060 | 12/2014 |

* cited by examiner

X-RAY AND γ-RAY PHOTODIODE

CROSS-REFERENCE TO RELATED APPLICATIONS

This application represents the U.S. National Phase of International Application number PCT/GB2018/050515 entitled "X-Ray and Gamma-Ray Photodiode" filed Feb. 28, 2018, which claims benefit to Great Britain No. 1703196.4 filed Feb. 28, 2017, all of which are incorporated herein by reference.

FIELD OF THE INVENTION

The present invention relates generally to photodiodes for detecting photons and in particular to a photodiode that has improved properties.

BACKGROUND

Photodiodes are commonly used as detectors of X-rays, gamma-rays (γ-rays) and other radiation. Most photodiodes for X-ray and γ-ray applications are made from silicon. In recent years much effort has been spent trying to develop alternative materials that, unlike silicon, can operate at high temperature, in intense radiation environments, and that are more efficient (i.e. detect a greater proportion of the incident radiation). Many materials have been investigated, including GaAs, AlGaAs, AlInP, SiC, CdTe and CdZnTe as some of the most promising. However, it has been found that these materials all suffer from significant problems, limitations or trade-offs. For example, whilst SiC is the most developed "modern" material for these photodiodes and it can operate in relatively high temperature and intense radiation environments, it is no more efficient than Silicon.

It is desired to use photodiodes, for example, in X-ray and γ-ray photon counting spectrometers. Such spectrometers are required for a multitude of applications in science and industry. By way of example, there is currently much commercial pressure to develop detectors for the interdiction of contraband nuclear material (e.g. nuclear weapons, "dirty bombs", etc.). However, the requirements of such photon counting spectrometers place extreme demands on the materials used in the photodiode.

It is desired to provide an improved photodiode.

SUMMARY

The present invention provides a photodiode for use in detecting X-rays and/or gamma rays, the photodiode comprising InGaP arranged and configured to absorb X-rays and/or gamma-rays incident on the photodiode and generate charge-carriers in response thereto.

The inventors have realised that the use of InGaP (also known as GaInP) as the active material in a photodiode enables the photodiode to be used for detecting X-rays and γ-rays. This is particularly surprising as InGaP is a ternary compound of InP and GaP, both of which are known to perform relatively poorly as the active material in X-ray and γ-ray photodiodes. For example, GaP has previously been found not to be spectroscopic at energies at low temperatures (≤−60° C.). As InGaP is a ternary compound of InP and GaP, InGaP would conventionally have been expected to have an even worse performance than either of its binary equivalents.

The use InGaP photodiodes is particularly advantageous in X-ray spectroscopy, and photon counting X-ray spectroscopy. InGaP detectors have been found to perform significantly better than the corresponding binary compounds GaP and InP and have been found to have high enough energy resolution to allow photon counting X-ray spectroscopy at room temperature, which is not true of GaP and InP based devices.

Furthermore, InGaP has a low leakage current and so photodiodes according to the embodiments herein may be operated at room temperature and above (i.e. ≥20° C.) without utilising cooling systems. This enables the X-ray and γ-ray detection system to have a relatively low mass, volume, and power requirements. The system may therefore be relatively inexpensive, compact and temperature tolerant and so is particularly useful in applications such as, for example, space missions or terrestrial applications outside the laboratory environment (e.g. underwater exploration). Instruments comprising cooling systems are also contemplated so as to allow the photodiode to operate in very high temperature environments. Due to the use of InGaP, the amount of cooling required would be zero or relatively low, e.g. as compared to a silicon based detector.

The use of InGaP in the photo-detector, as opposed to other conventional Aluminium containing semiconductor materials (such as AlInP), is advantageous as it enables Aluminium to be eliminated from the detector. This is advantageous as Aluminium, like silicon, is a material frequently of interest in planetary and geological X-ray fluorescence spectroscopy (XRF) and thus it is desirable to eliminate it from the detector in order to reduce the complexity of spectral analysis through the removal of these lines from the detector's self-fluorescence.

Due to the relatively high X-ray linear attenuation coefficients of InGaP (e.g. $In_{0.5}Ga_{0.5}P$) compared to those of some other wide bandgap materials (e.g. GaAs, AlGaAs, and AlInP), relatively thin InGaP detectors can be produced and improved high temperature performance can be achieved as a consequence not only of the wide bandgap but also the reduced volume of semiconductor material.

InGaP photodiodes also provide an alternative to GaAs, CdTe and CdZnTe for hard X-ray and gamma detection.

Furthermore, InGaP can be lattice matched to commercially available substrates, such as a GaAs substrate, and can be processed using commonly commercially available technologies.

The absorption of X-rays and/or gamma-rays by the InGaP material photo-generates electron-hole pairs.

The photodiode may comprise a housing or shield arranged and configured to block photons other than X-rays and/or gamma-rays from reaching the InGaP, and/or arranged and configured to block radioactive beta and/or alpha particles from reaching the InGaP.

The housing or shield may be configured to substantially block the passage of photons having a frequency lower than X-rays or gamma-rays. For example, the housing or shield may be arranged and configured to block blue light from reaching the InGaP.

The housing or shield may be metal, such as a metal foil. For example, the foil may be an Aluminium or Berylium foil. However, it is contemplated that other metals or materials may be used.

The photodiode may comprise a PIN junction or p-n junction formed by said InGaP

The PIN (e.g. $p^+$-i-$n^+$) junction may be formed by an undoped layer of InGaP arranged directly between a p-doped layer of InGaP and an n-doped layer of InGaP.

The inclusion of the intrinsic i-layer in the PIN junction may be used to provide a relatively large depletion zone and hence a relatively large volume to absorb X-rays and/or gamma-rays and generate the charge-carriers.

However, it is also contemplated that the InGaP may be provided in the form of a p-n junction. The p-n junction may be formed by a p-doped layer of InGaP contacting an n-doped layer of InGaP.

The i-layer of the PIN junction may have a thickness of: ≥5 µm, ≥10 µm, ≥15 µm, ≥20 µm, ≥25 µm, ≥30 µm, ≥35 µm, ≥40 µm, ≥45 µm, or ≥50 µm. Providing such a relatively thick i-layer enables a relatively high proportion of incident X-rays and/or gamma-rays to be absorbed so that a relatively high number or charge-carriers are generated and the photodiode is relatively efficient at generating a current from the X-rays and/or gamma-rays.

The p-layer and/or n-layer of the PIN junction may have a thickness of: ≤0.5 µm, ≤0.4 µm, ≤0.3 µm, ≤0.2 µm, or ≤0.1 µm. Providing such relatively thin layers limits the absorption of X-rays and/or gamma-rays by these layers. For example, if the p-layer (or n-layer) is arranged on the side of the junction that is towards the source of X-rays and/or gamma-rays, then the use of a relatively thin p-layer (or n-layer) will absorb a relatively small proportion of the photons, particularly for lower energy photons, such that a greater proportion of the incident X-rays and/or gamma-rays are able to pass into the i-layer of the PIN junction to be absorbed therein and generate the charge-carriers (although it is contemplated herein that part of the p-layer may also actively contribute to the generation of useful charge-carriers). If the n-layer (or p-layer) is arranged on the side of the junction that is away from the source of X-rays and/or gamma-rays, then the use of a relatively thin n-layer (or p-layer) will reduce the photon absorption and hence partial charge collection from this layer. This may, for example, improve spectral performance of the instrument.

The photodiode may comprise an electrode on either side of the PIN junction or p-n junction for applying a voltage across the junction and/or for measuring the photo-generated charge-carriers generated in the junction, wherein at least one of the electrodes does not cover a portion of the side of the junction on which it is located such that X-rays and/or gamma-rays can pass into the junction through said side without passing through said at least one electrode.

The at least one electrode may be annular, apertured, recessed or interdigitated so as not to cover the entirety of said side and to allow said X-rays and/or gamma-rays to pass into the junction without passing through the material forming the electrode.

The photodiode may comprise a voltage supply configured and set up to apply a reverse bias voltage across said PIN or p-n junction, wherein said voltage is ≥2 V, ≥3 V, ≥4 V, ≥4.5 V, or ≥5 V. Providing such a reverse bias voltage may provide a relatively large depletion depth as it sweeps the free charge-carriers out of the i-layer. This may also provide relatively low noise for certain sources of noise and enables relatively high resolution, for example, when the photodiode is used in an X-ray and/or gamma-ray spectrometer. However, it is also contemplated that a reverse bias may not be applied.

The InGaP may be a crystalline structure having a lattice composition $In_{0.5}Ga_{0.5}P$. Such compositions of InGaP enable the material to be lattice-matched to and grown on conventional substrates, such as GaAs. These proportions also enable the InGaP to be grown with high crystalline quality and/or to a relatively large thickness. This is particularly useful as, as described above, it may be desired to provide a relatively thick layer of InGaP in order to increase the probability that any given X-ray or gamma-ray photons will be absorbed in the material.

However, it is also contemplated that the InGaP material may be a crystalline structure having a lattice composition $In_xGa_{1-x}P$, wherein x is a value other than 0.5.

The InGaP may have been formed on a substrate, desirably a semiconductor substrate, such as GaAs.

The photodiode may have a mesa diode structure.

The photodiode may comprise one or more layers for forming an electrical contact on each side of the InGaP material. For example, the one of more layer may comprise at least one metal layer and/or at least one semiconductor layer. Examples of metal layers include gold and titanium. An example of a semiconductor layer includes InGe.

A bonding layer may be provided between the one or more layers for forming the electrical contact and the InGaP, for enabling the electrical contacts to bond well to the InGaP layer. The bonding layer may be a semiconductor, such as GaAs. One of the bonding layers may the substrate on which the InGaP was formed.

The InGaP material may be provided within a substantially planar structure, and the planar structure may comprise Schottky contacts and/or ions may have been implanted within the device to form regions of electrical resistance.

The ions may be implanted so as to form regions of electrical resistance that electrically isolate parts of the semiconductor wafer. For example, if multiple diode structures are provided then ions may be implanted to form regions that prevent a voltage on one diode structure from spreading to an adjacent diode.

The photodiode may be an avalanche diode or a non-avalanche diode.

The photodiode is desirably a single crystal InGaP detector, i.e. the InGaP is desirably in the form of a single lattice of InGaP. However, it is also contemplated that the InGaP material may be polycrystalline, i.e. comprising many crystals in the material, possibly having random orientations.

The photodiode may comprise a heterostructure formed from layers or regions of different semiconductors and therefore including heterojunctions. As discussed above, the InGaP material absorbs the X-rays and/or photons to generate the charge carriers, although different semiconductor layers may also be included for other functions. For example, a layer of another semiconductor (e.g. AlInP) may be included to receive charge-carriers from the InGaP material and generate secondary charge carriers, e.g. to amplify the number of charge-carriers and form an avalanche photodiode. However, it is also contemplated that the InGaP photodiode may include one or more homojunction so as to provide the avalanche effect.

The present invention also provides an X-ray and/or gamma-ray detector comprising the photodiode described herein, and comprising electronics for processing an electrical signal generated by the photodiode to determine if said electrical signal is due, at least in part, to the generation of said photo-generated charge-carriers.

The photodiode forms part of a circuit in the detector and the electronics may be set up and calibrated to detect the signal resulting from the generation of said charge-carriers. For example, in a current measurement mode, the portion of the signal above the dark current may be determined to have resulted from an X-ray and/or gamma-ray being received at the detector.

The present invention also provides an X-ray and/or gamma-ray photon counting spectrometer comprising the detector described herein, and comprising a processor set up and configured to determine the energies of individual X-ray and/or gamma-ray photons detected by the detector from said electrical signal and/or to determine the number of X-ray and/or gamma-ray photons detected by the detector from said signal.

For photon counting spectroscopy, the detector may be connected to an electronics chain typically composed of a charge sensitive preamplifier, a shaping amplifier, a multi-channel analyser, and a computer. When an X-ray or gamma-ray photon is absorbed by the InGaP material, some charges (a number of electrons and holes) are created in material. The amount of charge created is proportional to the energy of the photon. The charges are swept to the contacts of the detector and during their journey their movement induces charge on the contacts of the detector. One of the contacts is connected to the charge sensitive preamplifier, thus the charge sensitive preamplifier sees a charge at its input, which it converts to a voltage tail pulse that is proportional to the charge it receives. The shaping amplifier takes this tail pulse (which has a fast rise and a slow fall) and changes the shape of the pulse to make it easier for the multi-channel analyser to measure. The multi-channel analyser takes the output of the shaping amplifier and measures the pulse's height (which is proportional to the energy of the photon) and builds a histogram composed of this pulse and the others it has received, thus resulting in a spectrum that can be viewed on the computer.

The present invention also provides a system comprising a source of X-rays and/or gamma-rays and a photodiode, detector or spectrometer as described herein for detecting the X-rays and/or gamma-rays from said source.

The source of X-rays and/or gamma-rays referred to herein may be a primary source of X-rays and/or gamma-rays, such as a radioactive source. Alternatively, the source of X-rays and/or gamma-rays referred to herein may be a source of fluorescence X-rays and/or gamma-rays. Embodiments of the invention therefore extend to X-ray and/or gamma-ray spectroscopy of photons directly from a primary source as well as X-ray and/or gamma-ray fluorescence spectroscopy.

The system may be a nuclear or radioisotope battery comprising said source of X-rays and/or gamma-rays and said photodiode for converting said X-rays and/or gamma-rays into an electrical current.

The photodiode is configured to operate in a photovoltaic mode.

The nuclear or radioisotope battery may be a nuclear or radioisotope microbattery.

The battery may be configured such that a majority, or substantially all, of the electrical current (i.e. non-dark current) generated is from the photodiode converting X-rays and/or gamma-rays from said source into electrical current, e.g. rather than from alpha and beta particles.

The source may be radioactive material.

The source and photodiode may be housed within a housing, said housing optionally arranged and configured to substantially prevent said X-rays and/or gamma-rays from the source leaving the housing.

Although the source of X-rays and/or gamma rays has been described as being within the same housing as the photodiode, it is alternatively contemplated that one or more such source may not be located in a housing with the photodiode. For example, the photodiode may scavenge X-rays and/or gamma-rays from the environment in which the photodiode is located. Embodiments are contemplated wherein the source is nuclear waste that emits X-rays and/or gamma-rays and the photodiode in the battery converts these rays into electricity.

The photodiode may have any of the features described elsewhere herein. However, zero bias or a forward bias may be applied across the PIN or p-n junction, rather than a reverse bias.

The present invention also provides a method of detecting X-rays or gamma-rays comprising:

exposing the X-ray and/or gamma-ray detector described herein to a source of X-rays and/or gamma-rays; and determining from the signal generated by the photodiode that X-rays and/or gamma-rays have been received at the detector.

These method steps may be preceded by the steps of selecting said source of X-rays and/or gamma-rays and moving the detector towards said source. For example, the method may be used to deliberately analyse a specific source that has been selected.

The method may further comprise detecting the presence and/or location of said source of X-rays and/or gamma-rays using the detector. For example, the method may be used to detecting nuclear or radiological material.

The present invention also provides a method of counting X-ray and/or gamma-ray photons comprising:

exposing the X-ray and/or gamma-ray spectrometer described herein to a source of X-rays and/or gamma-rays; and determining, from the electrical signal generated by the photodiode, the energies of individual X-ray and/or gamma-ray photons detected by the detector from said electrical signal and/or determining the number of X-ray and/or gamma-ray photons that have been detected at the detector.

The various apparatus and methods described herein may be used in a large variety of different fields, including, scientific research, medicine, defense, security, food processing, space etc.

The photodiode described herein may be used in the detector in X-ray spectroscopy/spectrometry (e.g. X-ray fluorescence spectroscopy/spectrometry).

Although the photodiode, detector, spectrometer, system and methods have been described as being used for detecting X-rays and/or gamma-rays and/or for being used with a source of such X-rays and/or gamma-rays, it is contemplated that the instruments or method may detect other types of photons or to detect particles, such as electrons, ions, alpha particles or beta particles.

Accordingly, the present invention also provides a photon or particle detecting instrument comprising:

a diode comprising InGaP arranged and configured to absorb and/or interact with said photons or particles and generate charge-carriers in response thereto; and electronics for processing an electrical signal generated by the diode to determine if said electrical signal is due, at least in part, to the generation of said charge-carriers.

The diode may have the features of the photodiode described herein, except that the diode may interact with particles or photons to generate the charge carriers.

The instrument may comprise a user interface, such as a display or speaker, and a controller to control the interface to inform a user that said photons or particles have been detected.

The present invention also provides a photon or particle counting spectrometer comprising the instrument described herein, and comprising a processor set up and configured to determine the energies of individual photons or particles detected by the instrument from said electrical signal and/or to determine the number of photons or particles detected by the instrument from said signal.

The spectrometer may output said energies or numbers to said user interface.

The present invention also provides a system comprising a source of photons or particles and an instrument or spectrometer as described herein for detecting the photons or particles from said source.

The present invention also provides a method of detecting photons or particles comprising:

exposing the instrument described herein to a source of said photons or particles; and determining from the signal generated by the diode that photons or particles have been received at the instrument.

The method may comprise sending an output to an electronic user interface, such as a display or speaker, to inform a user that said photons or particles have been detected.

The present invention also provides a method of counting photons or particles comprising:

exposing the spectrometer of described herein to a source of photons or particles; and determining, from the electrical signal generated by the diode, the energies of individual photons or particles detected by the instrument from said electrical signal and/or determining the number of photons or particles that have been detected at the instrument.

Although a nuclear battery has been described that uses a photodiode to convert X-rays and/or gamma rays directly to electricity (via InGaP), it is contemplated that the battery may first convert the X-rays and/or gamma rays to other types of photons or particles and those other photons or particles may impact on the InGaP material to generate the charge carriers.

Accordingly, the invention also provides a nuclear or radioisotope battery comprising:

a converter for absorbing or interacting with X-rays and/or gamma-rays and generating other types of photons or particles in response thereto; and a diode comprising InGaP arranged to receive said photons or particles and convert them into an electrical current.

The battery may comprise the source of X-rays and/or gamma-rays, e.g. in the same housing as the diode, or may alternatively receive the X-rays and/or gamma-rays from the local environment.

BRIEF DESCRIPTION OF THE DRAWINGS

Various embodiments will now be described, by way of example only, and with reference to the accompanying drawings in which.

DETAILED DESCRIPTION

Figure 1:
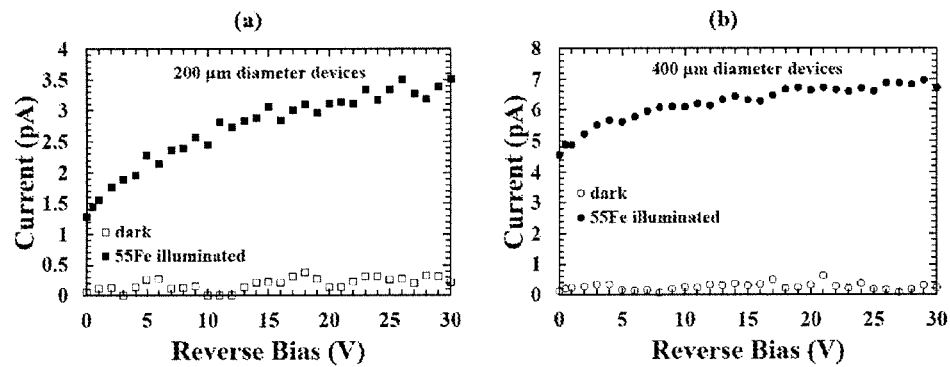
FIGS. 1A-1B show how the currents generated by two different sized photodiodes vary as a function of the applied reverse bias.

An exemplary embodiment of an InGaP photodiode will now be described, by way of example only, to assist in the understanding of the invention. It will be appreciated that the invention is not limited to including all of the layers described, or the specific composition of the various layers in this example.

With reference to Table 1 below, the exemplary photodiode comprises the nine layers shown. An $In_{0.5}Ga_{0.5}P$ wafer (layers 4-6 in Table 1) was grown by metalorganic vapour phase epitaxy (MOVPE) on an $n^+$ doped GaAs substrate (layer 7 in Table 1) so as to form a $p^+$-i-$n^+$ structure. The layers of the $In_{0.5}Ga_{0.5}P$ wafer were successively grown on the GaAs substrate so as to form a silicon doped $n^+$ layer of $In_{0.5}Ga_{0.5}P$ having a doping concentration of $2\times10^{18}$ cm$^{-3}$ and a thickness of 0.1 µm (layer 6 in Table 1), followed by an intrinsic layer of $In_{0.5}Ga_{0.5}P$ having no doping and a thickness of 5 µm (layer 5 in Table 1), followed by a zinc p$^+$ doped layer of $In_{0.5}Ga_{0.5}P$ having a doping concentration of $2\times10^{18}$ cm$^{-3}$ and a thickness of 0.2 µm (layer 4 in Table 1). A highly doped zinc p$^+$ doped layer of GaAs having a doping concentration of $1\times10^{19}$ cm$^{-3}$ and a thickness of 0.01 µm (layer 3 in Table 1) was grown on top of the p$^+$ doped layer of $In_{0.5}Ga_{0.5}P$ (layer 4 in Table 1) to facilitate Ohmic contacting.

Chemical wet etching techniques were then used to etch the layers to fabricate circular mesa photodiodes having diameters of 200 µm and 400 µm. A 1:1:1 solution of $K_2Cr_2O_7$:HBr:$CH_3COOH$, followed by 10 s in a 1:8:80 solution of $H_2SO_4$:$H_2O_2$:$H_2O$ were used to etch the circular mesa photodiodes. The $In_{0.5}Ga_{0.5}P$ devices were unpassivated.

An Ohmic top contact was formed on the highly doped layer of GaAs (layer 3 in Table 1) by depositing a layer of gold having a thickness of 0.2 µm (layer 2 in Table 1) and then a layer of titanium having a thickness of 0.02 µm (layer 1 in Table 1). The top Ohmic contact had an annular shape so as to allow the passage of photons through the aperture in the Ohmic contact. The annular Ohmic contact covered 33% and 45% of the top face in the 400 µm and 200 µm diameter photodiode, respectively. An Ohmic rear contact was formed on the rear of the GaAs substrate (layer 7 in Table 1) by depositing a layer of gold having a thickness of 0.2 µm (layer 8 in Table 1) and then a layer of InGe having a thickness of 0.02 µm (layer 9 in Table 1).

TABLE 1

| Layer | Material | Thickness (µm) | Dopant | Dopant Type | Doping density (cm$^{-3}$) |
|---|---|---|---|---|---|
| 1 | Ti | 0.02 | | | |
| 2 | Au | 0.2 | | | |
| 3 | GaAs | 0.01 | Zn | p$^+$ | $1\times10^{19}$ |
| 4 | $In_{0.5}Ga_{0.5}P$ | 0.2 | Zn | p$^+$ | $2\times10^{18}$ |
| 5 | $In_{0.5}Ga_{0.5}P$ | 5 | undoped | | |
| 6 | $In_{0.5}Ga_{0.5}P$ | 0.1 | Si | n$^+$ | $2\times10^{18}$ |
| 7 | Substrate n$^+$ GaAs | | | n$^+$ | |
| 8 | Au | 0.2 | | | |
| 9 | InGe | 0.02 | | | |

It was determined that for the areas of the photodiodes not covered by the top annular Ohmic contact, the X-ray quantum efficiencies (QE) were 53% and 44% at energies of 5.9 keV and 6.49 keV, respectively, calculated using the Beer-Lambert law and assuming complete charge collection in the p and i layers. For the areas covered by the annular top contact this reduced to 44% and 38%, respectively. The linear attenuation coefficients used in the QE calculations were 0.132 µm$^{-1}$ and 0.102 µm$^{-1}$ at 5.9 keV and 6.49 keV, respectively. These values are higher than other semiconductors such as Si, GaAs, and $Al_{0.52}In_{0.48}P$.

Electrical characteristics of the 200 µm and 400 µm diameter InGaP photodiodes were investigated.

The currents generated by the InGaP photodiodes were investigated as a function of reverse bias applied across the photodiode under dark conditions (i.e. with no x-ray or gamma ray source) and under the illumination of an $^{55}$Fe radioisotope X-ray source (Mn K$\alpha$=5.9 keV, Mn K$\beta$=6.49 keV). The X-ray source was positioned 6 mm above the top of each mesa photodiode. The photodiodes were investigated at room temperature and in a dry nitrogen atmosphere (relative humidity<5%). A Keithley 6487 picoammeter/voltage source was used during the experiment. The uncertainty associated with the current readings was 0.3% of their values plus 400 fA, while the uncertainty associated with the applied biases was 0.1% of their values plus 1 mV.

FIG. 1A shows the current curves as a function of reverse bias for a 200 µm diameter photodiode. The lower plot formed from empty squares shows the current as a function of reverse bias when the photodiode was under the dark condition and the upper plot formed from filled in squares shows the current as a function of reverse bias when the photodiode was illuminated by the X-ray source. FIG. 1B shows the current curves as a function of reverse bias for a 400 µm diameter photodiode. The lower plot formed from empty squares shows the current as a function of reverse bias when the photodiode was under the dark condition and the upper plot formed from filled in squares shows the current as a function of reverse bias when the photodiode was illuminated by the X-ray source. It can be seen from FIGS. 1A-1B that for both diameter photodiodes the dark current values were less than 0.22 pA (corresponding to current densities of $6.7\times10^{-10}$ A/cm$^2$ and $1.7\times10^{-10}$ A/cm$^2$ for the 200 µm and 400 µm diameter devices, respectively). Illuminated currents of 3.5 pA and 7 pA were observed at a reverse bias of 30 V for the 200 µm and the 400 µm diameter photodiodes, respectively. By subtracting the illuminated currents from the dark currents, it can be determined that photocurrents of 3.3 pA and 6.5 pA occurred at a reverse bias of 30 V for the 200 µm and the 400 µm diameter devices, respectively.

The capacitance of the photodiodes was also studied as a function of reverse bias from 0 V to 30 V using an HP 4275A Multi Frequency LCR meter. The test signal was sinusoidal with a 50 mV rms magnitude and a 1 MHz frequency. The uncertainty associated with each capacitance reading was ~0.12% plus an experimental repeatability error of (±0.07 pF). The uncertainty associated with the applied biases was 0.1% of their values plus 1 mV. The capacitance of an identical empty package was also measured and subtracted from the measured capacitance of each packaged photodiode to determine the capacitances of the devices themselves.

Figure 2:
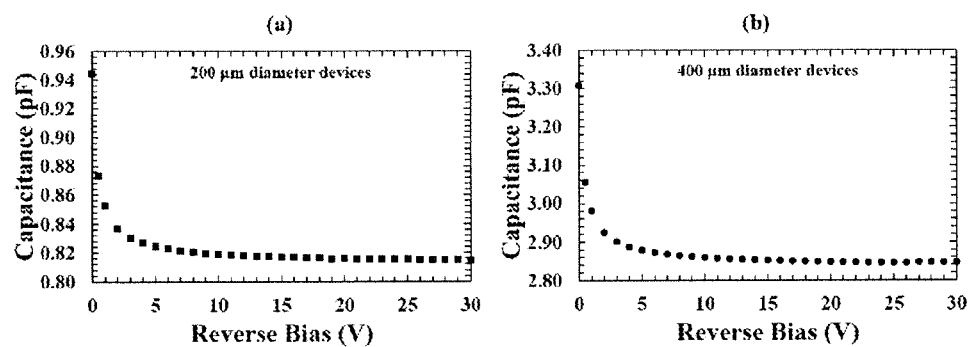
FIGS. 2A-2B show how the capacitances of the two different sized photodiodes vary as a function of the applied reverse bias.

FIG. 2A shows the capacitance as a function of applied reverse bias for the 200 µm diameter photodiode, whereas FIG. 2B shows the capacitance as a function of applied reverse bias for the a 400 µm diameter photodiode.

The depletion depth (W) of each photodiode was then calculated from $W=(\varepsilon_0\varepsilon_r A)/C$, where $\varepsilon_0$ is the permittivity of a vacuum, $\varepsilon_r$ is the $In_{0.5}Ga_{0.5}P$ dielectric constant, A is the device area and C is the capacitance.

Figure 3:
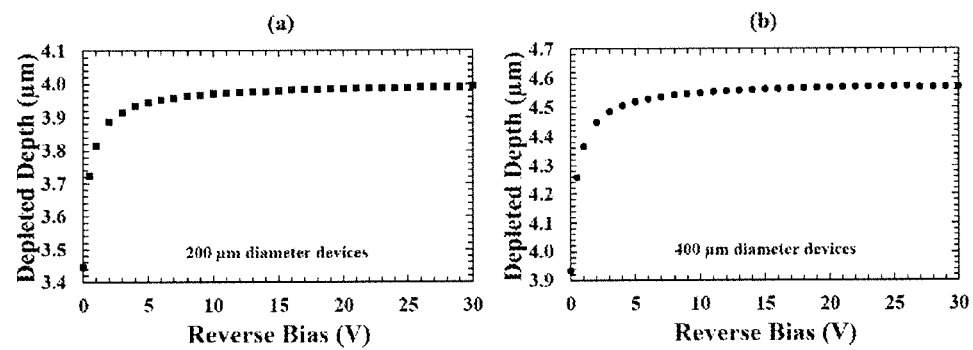
FIGS. 3A-3B show how the depletion depths of the two different sized photodiodes vary as a function of the applied reverse bias.

FIG. 3A shows the depletion depth as a function of applied reverse bias for the 200 µm diameter photodiode, whereas FIG. 2B shows the depletion depth as a function of applied reverse bias for the 400 µm diameter photodiode. It can be seen from FIGS. 3A-3B that at low reverse biases, as the reverse bias is increased the depletion depth increases. Above a reverse bias voltage of about 5 V, the depletion depth remained almost constant as the reverse bias increases (due to the i-layer in the PIN structure being fully swept-out of charge carriers at these biases). At a reverse bias voltage of 30 V, depletion depths of 4.0 µm±0.5 µm and 4.6 µm±0.2 µm were measured for the 200 µm and 400 µm diameter devices, respectively.

The doping concentration (N) below the p⁺-i junction (i.e. the junction between layers 4 and 5 in Table 1 above) as a function of depletion depth (W) was calculated from:

$$N(W) = \frac{2}{q\varepsilon_0\varepsilon_r A^2}\left(\frac{dV}{d[1/C^2]}\right)$$

where q is the electronic charge, $\varepsilon_0$ is the permittivity of a vacuum, $\varepsilon_r$ is the relative permittivity of $In_{0.5}Ga_{0.5}P$, A is the device area, and C is the capacitance.

Figure 4:
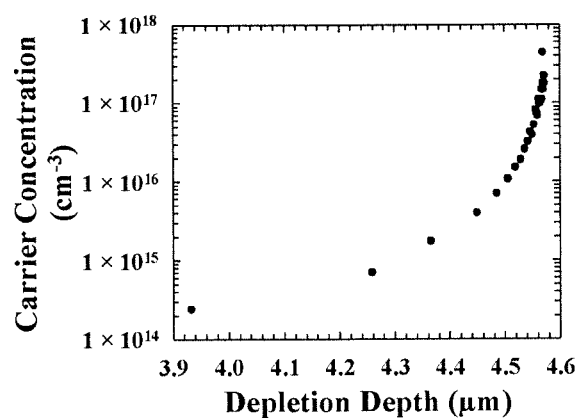
FIG. 4 shows how the doping concentration in a photodiode varies as a function of the depletion depth.

FIG. 4 shows the obtained doping concentration N(W) for the 400 µm diameter $In_{0.5}Ga_{0.5}P$ device.

The (non-avalanche) mesa photodiodes having diameters of 200 µm and 400 µm were connected to low-noise, charge sensitive preamplifier electronics in order to realise an X-ray spectrometer. By way of example, the instrument was capable of a system energy resolution of 900 eV at 5.9 keV for a 200 µm photodiode operated at reverse biases above 5 V.

X-ray spectra from a $^{55}$Fe radioisotope X-ray source were collected using the 200 µm and 400 µm diameter devices. The distance between the top surface of the InGaP photodiodes and the X-ray source was 6 mm. A low-noise, charge-sensitive preamplifier of feedback resistorless design (similar to that in Bertuccio, P. Rehak, and D. Xi, Nucl. Instrum. Meth. Phys. Res. A 326, 71 (1993)) was connected to each InGaP diode. The signal from the preamplifier was amplified and shaped using an Ortec 572a shaping amplifier, the output of which was connected to an Ortec Easy-MCA-8K multichannel analyser. Spectra were accumulated with the diodes reverse biased at 0 V, 5 V, 10 V and 15 V. A shaping time of 10 µs and a live time limit of 100 s for each spectrum were used.

Figure 5:
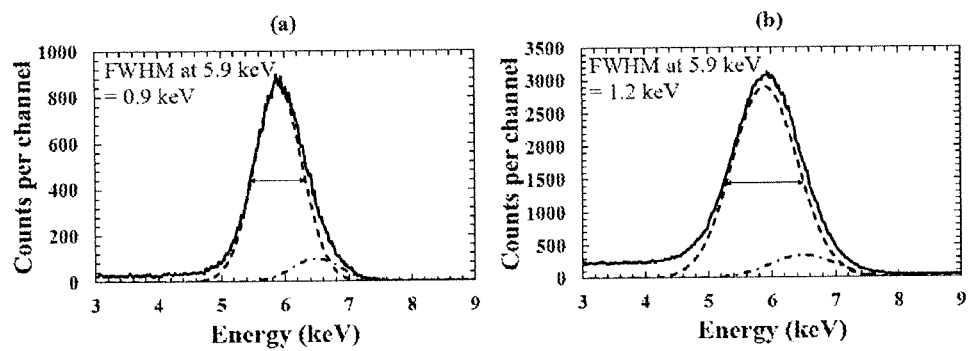
FIGS. 5A-5B show X-ray spectra obtained by the two different sized photodiodes.

FIGS. 5A and 5B show the X-ray spectra obtained with a reverse bias of 5 V for the 200 µm and 400 µm diameter devices, respectively. In each spectrum, the observed $^{55}$Fe photopeak was the combination of the Mn Kα and Mn Kβ lines at 5.9 keV and 6.49 keV, respectively. Gaussians were fitted to the combined peak taking into account the relative X-ray emission rates of the $^{55}$Fe radioisotope X-ray source at 5.9 keV and 6.49 keV in the appropriate ratio [U. Shotzig, Applied Radiation and Isotopes 53, 469 (2000)] and the relative difference in efficiency of the detector at these X-ray energies.

The InGaP spectrometer energy resolution, as quantified by the FWHM at 5.9 keV, was studied as a function of detector reverse bias. At a reverse bias of 0 V, the FWHM at 5.9 keV was the poorest obtained (FWHM at 5.9 keV of 1 keV and 1.4 keV were observed for the 200 µm and 400 µm diameter devices, respectively). This was due to the increased contribution of incomplete charge collection noise which reduced at higher reverse biases. At reverse biases of 5 V and above, the charge collection efficiency increased (the incomplete charge collection noise decreased) and the FWHM at 5.9 keV improved and remained constant with further increased reverse bias within the range investigated. At a reverse bias of 5 V, a FWHM at 5.9 keV of 0.9 keV and 1.2 keV were observed for both 200 µm and 400 µm diameter devices, respectively.

Noise analyses were carried out in order to identify the different noise contributions to the FWHM broadening. The spectral resolution of a non-avalanche photodiode X-ray spectrometer is given by:

$$\Delta E[\text{eV}] = 2.355\omega\sqrt{\frac{FE}{\omega} + R^2 + A^2}$$

where ΔE is the FWHM, ω is the electron-hole pair creation energy, F is the Fano factor, E is the energy of the X-ray photon absorbed, and R and A are the electronic noise and the incomplete charge collection noise, respectively [G. Lioliou, and A. M. Barnett, Nucl. Instrum. Meth. Phys. Res. A 801, 63 (2015)]. The fundamental "Fano limited" energy resolution (i.e. R=0 and A=0) for $In_{0.5}Ga_{0.5}P$ was estimated to be 137 eV, assuming an $In_{0.5}Ga_{0.5}P$ electron-hole pair creation energy of 4.8 eV (2.5 times the bandgap) and a Fano factor of 0.12. This noise contribution takes into account the statistical nature of the ionisation process in a semiconductor X-ray detector. Since the measured FWHM was bigger than 137 eV, it was required to consider the contributions from the other noise sources. The electronic noise of the system consists of parallel white noise, series white noise, induced gate current noise, 1/f noise, and dielectric noise. The leakage currents of the detector and input JFET of the preamplifier are drivers of the parallel white noise, whilst the capacitances of the detector and input JFET of the preamplifier determine the series white noise and 1/f noise. The series white noise was adjusted for induced gate current noise.

Figure 6:
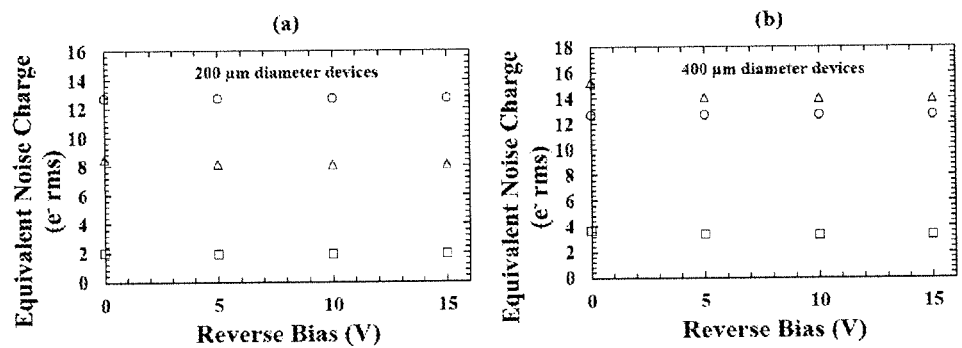
FIGS. 6A-6B show the parallel white noise, series white noise, and 1/f noise as a function of applied reverse bias for the two different sized photodiodes.

FIGS. 6A and 6B show the calculated parallel white noise, series white noise, and 1/f noise as functions of detector reverse bias for the 200 µm diameter device and the 400 µm diameter device, respectively. The parallel white noise contributions are shown as circles, the series white noise contributions are shown as triangles, and the 1/f noise contributions are shown as squares. It can be seen that the parallel white noise contributions were similar for the 200 µm and the 400 µm diameter devices at each reverse bias. This was due to similar dark currents in devices of both sizes, as shown in FIGS. 1A-1B. In contrast, the series white noise and the 1/f noise were greater for the 400 µm diameter device as compared with the 200 µm diameter device. This was due to the greater capacitance measured for the bigger diameter device, as shown in FIGS. 2A-2B. The increased FWHM observed for the 400 µm diameter devices can be explained in part by considering the increased series white noise and the 1/f noise contributions.

The Fano noise, the parallel white noise, the series white noise, and the 1/f noise contributions at 5.9 keV were subtracted in quadrature from the measured FWHM at 5.9 keV in order to compute the combined contribution of the dielectric noise and incomplete charge collection noise at 5.9 keV.

Figure 7:
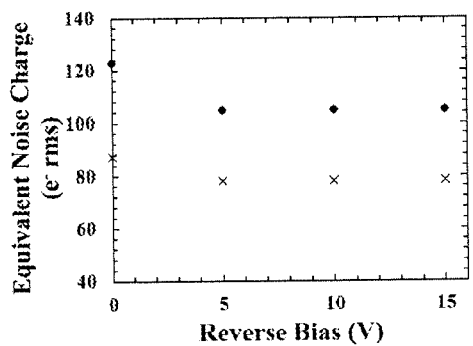
FIG. 7 shows the equivalent noise charge as a function of applied reverse bias for the two different sized photodiodes.

FIG. 7 shows the equivalent noise charge of the dielectric noise and incomplete charge collection noise as a function of reverse bias for the spectrometer with the 200 µm device (plotted as crosses) and the 400 µm device (plotted as diamonds). The combined contribution of the dielectric noise and incomplete charge collection noise was greater for the 400 µm devices than the 200 µm devices at all the reverse biases. At a 0 V reverse bias, the combined contribution had an equivalent noise charge of 123 e– rms and 87 e– rms for the 400 µm device and the 200 µm device, respectively. At reverse biases above 5 V, equivalent noise charges of 105 e– rms and 78 e– rms were computed for the 400 µm and the 200 µm devices, respectively. Since the dielectric noise was independent from the detector bias, the difference in combined equivalent noise charge from dielectric noise and incomplete charge collection noise observed at 0 V compared with that at 5 V can be attributed to incomplete charge collection noise at 0 V. Thus it can be said that at 0 V there were 18 e– rms and 9 e– rms of incomplete charge collection noise using the 400 μm and 200 μm devices, respectively, and that incomplete charge collection noise was insignificant at reverse biases ≥5 V.

In FIG. 7 the equivalent noise charge at reverse biases of ≥5 V is due to the dielectric contribution. The dielectric equivalent noise charge ($ENC_D$) is given by:

$$ENC_D = \frac{1}{q}\sqrt{A_2 2kTDC}$$

where q is the electric charge, $A_2$ is a constant (1.18) depending on the type of signal shaping [E. Gatti, P. F. Manfredi, M. Sampietro, and V. Speziali, Nucl. Instrum. Meth. Phys. Res., A 297, 467 (1990)], k is the Boltzmann constant, T is temperature, D is the dissipation factor and C is the capacitance [G. Lioliou, and A. M. Barnett, Nucl. Instrum. Meth. Phys. Res. A 801, 63 (2015)]. Using the equation for $ENC_D$ given above and the experimental data of FIG. 7, an effective dielectric dissipation factor as high as $(4.2\pm0.4)\times10^{-3}$ was found. It should be noted that this does not correspond directly to the dissipation factor of $In_{0.5}Ga_{0.5}P$, but rather it is indicative of the effective combined dissipation factor of all dielectrics contributing to this noise as it is analyzed here.

Although examples of the energy resolution (FWHM) have been given herein, higher resolutions are achievable, e.g. by using preamplifiers having lower electronic noise.

The effect on detection efficiency caused by the thickness of the intrinsic layer in an $In_{0.5}Ga_{0.5}P$ $p^+$-i-$n^+$ structure was also investigated. It was assumed that a GaAs $p^+$ side cap was arranged on the $p^+$ side of the $p^+$-i-$n^+$ structure, and that the photons were incident on this side of the device. It was also assumed that only the intrinsic layer in the $p^+$-i-$n^+$ structure was active.

Figure 8A:
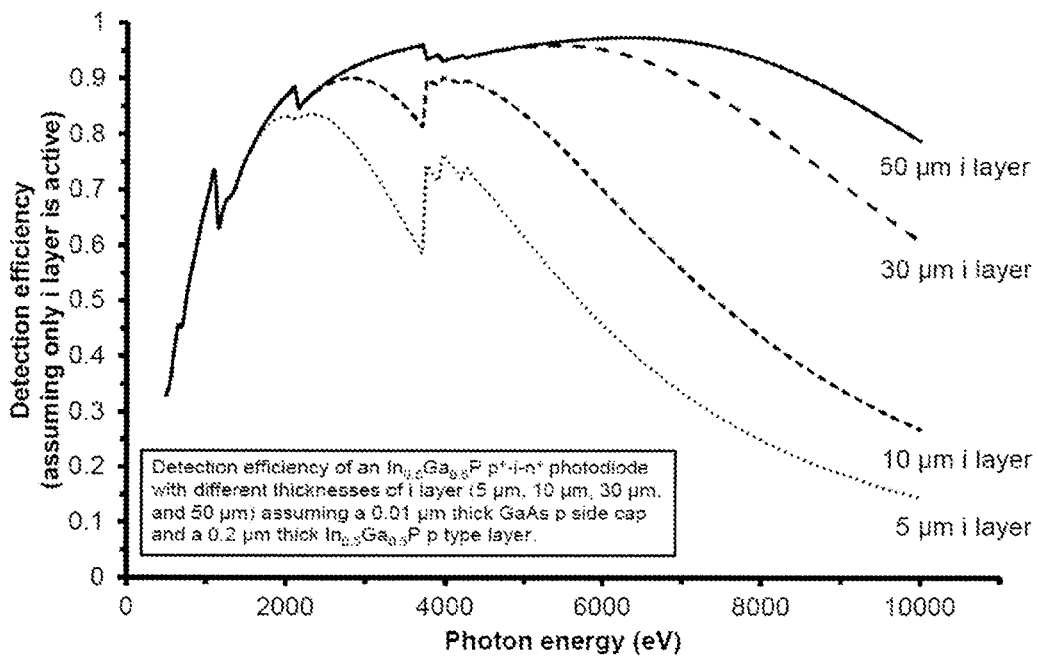
FIGS. 8A-8B show how the detection efficiencies of PIN structures having layers of different thicknesses vary as a function of the energy of the photons incident on the structures.

FIG. 8A shows the detection efficiency of the $p^+$-i-$n^+$ structure as a function of the energy of the photons incident on the structure, for four $p^+$-i-$n^+$ structures having intrinsic layers with thicknesses of 5 μm, 10 μm, 30 μm and 50 μm. The thickness of the $p^+$ layer in each $p^+$-i-$n^+$ structure was 0.2 μm. It can be seen that at relatively low photon energies, the detection efficiency is substantially the same for all of the structures even though they have intrinsic layers of different thickness. However, as the photon energy increases, structures having thinner intrinsic layers have lower detection efficiencies.

Figure 8B:
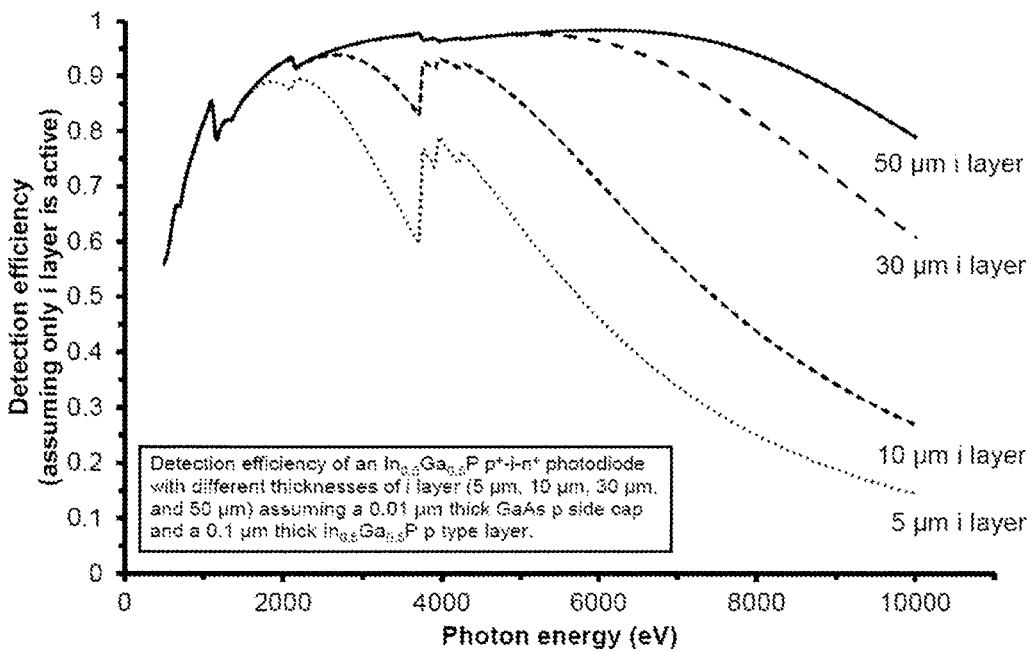

FIG. 8B shows the detection efficiencies of $p^+$-i-$n^+$ structures corresponding to those of FIG. 8A, except in which the thickness of the $p^+$ layer in the $p^+$-i-$n^+$ structure is 0.1 μm (rather than 0.2 μm). The plots in FIG. 8B follow the same pattern as the plots in FIG. 8A, except that in FIG. 8B the detection efficiencies are higher at lower photon energies.

From FIGS. 8A-8B it can be seen that at low photon energies the detection efficiency is dominated by the thickness of the $p^+$ layer in the $p^+$-i-$n^+$ structure. In other words, at low photon energies, the thicker the $p^+$ layer in the $p^+$-i-$n^+$ structure is, the lower the detection efficiency is. However, at higher photon energies, the detection efficiency is dominated by the thickness of the intrinsic layer in the $p^+$-i-$n^+$ structure. In other words, at higher photon energies, the thicker the intrinsic layer is, the higher the detection efficiency is.

Although not shown in FIGS. 8A-8B, the detection efficiency at a photon energy of 59.5 keV is of particular interest as this is the energy of a gamma ray from $^{241}$Am. At such high energies, both the $p^+$ layer in the GaAs side cap and the $p^+$ layer in the $p^+$-i-$n^+$ structure are more or less transparent to the photons, and the detection efficiency is therefore limited by the thickness of the intrinsic layer in the $p^+$-i-$n^+$ structure. For example, for photons having an energy of 59.5 keV, the detection efficiency of a 5 μm thick intrinsic layer would be 0.005, whereas the detection efficiency of a 50 μm thick intrinsic layer would be 0.05.

High-resolution X-ray astronomy and X-ray fluorescence spectroscopy have been made possible because of the use of photon counting X-ray spectrometers. The ability to determine the energy of individual X-ray photons and the number of the detected X-ray photons at a particular energy can be essential, e.g. in space missions. These attributes are particularly useful to study planetary surfaces, magnetospheres, and solar physics, as well as for terrestrial applications such as industrial monitoring and non-destructive testing. As described hereinabove, the use of wide bandgap materials in such spectrometers is attractive because such materials can have low thermally generated leakage currents; as such they can operate at high temperatures without cooling systems thus resulting in more compact, lower mass, and lower power instrumentation.

High energy resolution and temperature tolerant photon counting X-ray spectrometers have been reported using various wide bandgap semiconductors detectors coupled to low-noise preamplifiers electronics. However, the embodiments of the present invention provide improved such instruments.

With reference to Table 2 below, an $In_{0.5}Ga_{0.5}P$ $p^+$-i-$n^+$ epilayer was grown on a heavily doped n+ GaAs substrate by low-pressure (150 Torr) metalorganic vapour phase epitaxy using trimethylgallium, trimethylindium, arsine, and phosphine as precursors, and hydrogen as a carrier gas. Disilane and dimethylzinc:triethylamine were used for n- and p-doping, respectively. The epitaxial surface of the substrate had an orientation of (100) with a miscut angle of 10° towards <111>A. The unintentionally doped i-layer (thickness of 5 μm) was between a top p+ layer (thickness of 0.2 μm; doping concentration of $2\times10^{18}$ cm$^{-3}$) and a bottom n+ layer (thickness of 0.1 μm; doping concentration of $2\times10^{18}$ cm$^{-3}$). It has to be noted that the thickness of the p+ and n+ layers were as thin as possible such to decrease the absorption in these layers. The thicknesses for the p+ layer (0.2 μm) and n+ layer (0.1 μm) were chosen based on experience of growth of high quality $In_{0.5}Ga_{0.5}P$. The thickness of the i-layer, instead, was thick to increase the absorption, and consequently the quantum efficiency, in this layer. It has to be highlighted that the $In_{0.5}Ga_{0.5}P$ device is the thickest i-layer $In_{0.5}Ga_{0.5}P$ photodiode so far reported, although i-layers thicker than 5 μm may be provided. On top of the $In_{0.5}Ga_{0.5}P$ $p^+$-i-$n^+$ epilayer, a thin p+GaAs layer (thickness of 0.01 μm; doping concentration of $1\times10^{19}$ cm$^{-3}$) was grown to help achieve a good top Ohmic contact. n type GaAs, n type $In_{0.5}Ga_{0.5}P$ and unintentionally doped $In_{0.5}Ga_{0.5}P$ were grown at a temperature of 700° C., and the subsequent p-doped layers were grown at 660° C. At room temperature, the grown $In_{0.5}Ga_{0.5}P$ had a photoluminescence peak energy of 1.89 eV. This energy is in good agreement with the bandgap of the material with a suppressed spontaneous long-range ordering in the group III sublattice. The Ohmic contact on top of the p+ GaAs layer was formed from Ti (thickness of 20 nm) and Au (thickness of 200 nm). The Ohmic rear contact, deposited onto the rear of the n+ GaAs substrate, was formed from InGe (thickness of 20 nm) and Au (thickness of 200 nm). The $In_{0.5}Ga_{0.5}P$ photodiode was not passivated. Chemical wet etching techniques (1:1:1 K2Cr2O7:HBr:CH3COOH solution followed by a 10 s finishing etch in 1:8:80 H2SO4:H2O2:H2O solution) were used to fabricate the 200 μm diameter $In_{0.5}Ga_{0.5}P$ mesa device used in the study. The device layers, their relative thicknesses and materials are summarised in Table 2 below:

TABLE 2

| Layer | Material | Thickness (μm) | Dopant | Dopant Type | Doping density $(cm^{-3})$ |
|---|---|---|---|---|---|
| 1 | Ti | 0.02 | | | |
| 2 | Au | 0.2 | | | |
| 3 | GaAs | 0.01 | Zn | $p^+$ | $1 \times 10^{19}$ |
| 4 | $In_{0.5}Ga_{0.5}P$ | 0.2 | Zn | $p^+$ | $2 \times 10^{18}$ |
| 5 | $In_{0.5}Ga_{0.5}P$ | 5 | undoped | | $<5 \times 10^{16}$ |
| 6 | $In_{0.5}Ga_{0.5}P$ | 0.1 | Si | $n^+$ | $2 \times 10^{18}$ |
| 7 | GaAs buffer | 0.3 | Si | $n^+$ | $2 \times 10^{18}$ |
| 8 | Substrate $n^+$ GaAs | 350 | Si | $n^+$ | $2 \times 10^{18}$ |
| 9 | InGe | 0.02 | | | |
| 10 | Au | 0.2 | | | |

A 192 MBq $^{55}$Fe radioisotope X-ray source (Mn Kα=5.9 keV, Mn Kβ=6.49 keV) was positioned 5 mm away from the top surface of the 200 μm diameter $In_{0.5}Ga_{0.5}P$ mesa photodiode such to study the detector performances under illumination.

The $In_{0.5}Ga_{0.5}P$ X-ray quantum efficiencies (QE) through the device's optical window (region not covered by contacts) were calculated using the Beer-Lambert law and assuming complete charge collection in the p and i layers.

Figure 10:
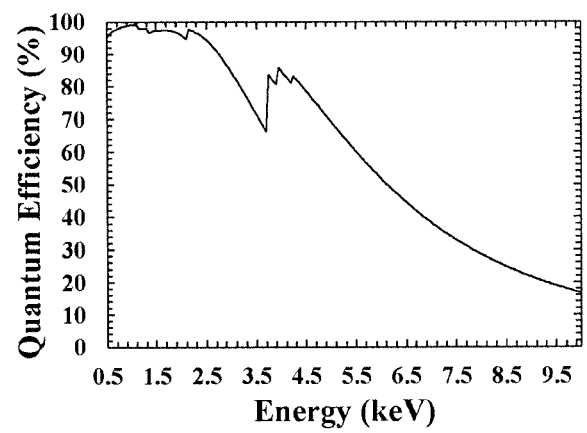
FIG. 10 shows $In_{0.5}Ga_{0.5}P$ X-ray quantum efficiencies as a function of photon energy up to 10 keV1.

FIG. 10 shows the $In_{0.5}Ga_{0.5}P$ X-ray quantum efficiencies as a function of photon energy up to 10 keV. X-ray quantum efficiencies (QE) of 53% at 5.9 keV and 44% at 6.49 keV were computed for the structure. Table 3 below shows the attenuation coefficients at 5.9 keV and 6.49 keV for $In_{0.5}Ga_{0.5}P$ as well as other different materials. The attenuation coefficients for binary and ternary compounds were estimated from the attenuation coefficients of their single elements, properly weighted.

TABLE 3

| Material | Attenuation coefficient at 5.9 keV $(cm^{-1})$ | Attenuation coefficient at 6.49 keV $(cm^{-1})$ |
|---|---|---|
| $In_{0.5}Ga_{0.5}P$ | 1464 | 1130 |
| $Al_{0.52}In_{0.48}P$ | 1301 | 1004 |
| GaAs | 837 | 642 |
| $Al_{0.8}Ga_{0.2}As$ | 788 | 604 |
| Si | 346 | 263 |

The $In_{0.5}Ga_{0.5}P$ device was installed inside a TAS Micro MT climatic cabinet for temperature control. The temperature was initially set to 100° C. and decreased to 20° C., in steps of 20° C. Before taking any measurements at each temperature, the device was left for 30 minutes to ensure stabilisation. The $In_{0.5}Ga_{0.5}P$ leakage current as a function of reverse bias was measured using a Keithley 6487 picoammeter/voltage source. The uncertainty associated with individual current readings was 0.3% of their values plus 400 fA, while the uncertainty associated with applied biases was 0.1% of their values plus 1 mV. The $In_{0.5}Ga_{0.5}P$ capacitance as a function of reverse bias was measured using an HP 4275A Multi Frequency LCR meter. The uncertainty associated with each capacitance reading was 0.12%, while the uncertainty associated with applied biases was 0.1% of their values plus 1 mV. The test signal was sinusoidal with a 50 mV rms magnitude and 1 MHz frequency. In both leakage current and capacitance measurements, the reverse bias increased from 0 V to 15 V (in 1 V increments).

X-ray spectra were obtained using the $^{55}$Fe radioisotope X-ray source to illuminate the 200 μm diameter $In_{0.5}Ga_{0.5}P$ device at temperatures from 100° C. to 20° C. The experimental setup utilised a custom-made charge-sensitive preamplifier of feedback resistorless design. The preamplifier was operated at the same temperature as the photodiode. The signal from the preamplifier was shaped by an Ortec 572a shaping amplifier, and digitized by a multichannel analyser (Ortec Easy-MCA-8K). Spectra were accumulated and analysed at shaping times of 0.5 μs, 1 μs, 2 μs, 3 μs, 6 μs, and 10 μs. The $In_{0.5}Ga_{0.5}P$ device was reverse biased at 0 V, 5 V, 10 V, and 15 V, in each case. The live time for each spectrum was 200 s. The experiments were performed in dry nitrogen atmosphere (relative humidity<5%).

Figure 11:
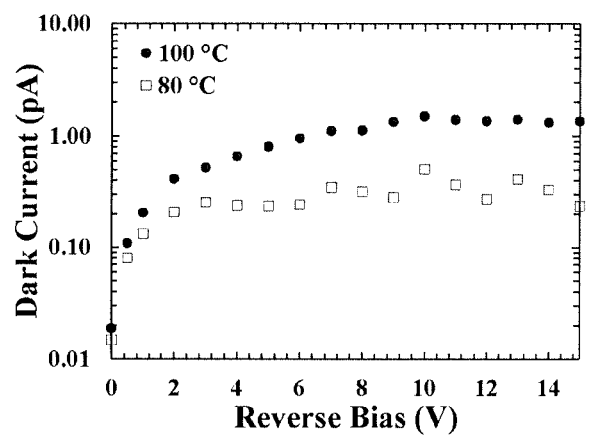
FIG. 11 shows measured leakage currents of a packaged device at 100° C. and 80° C.

The measured leakage currents of the packaged device at 100° C. and 80° C. are shown in FIG. 11; leakage currents at temperatures below 80° C. are not reported because they were below the picoammeter's noise floor. Measurements of the leakage current as a function of the reverse bias of an empty package showed that the package of the diode was contributing significantly to the measured leakage current. At 100° C. and at 80° C., the packaged device (defined as the semiconductor and package combined) had leakage currents of 1.5 pA and 0.5 pA, respectively, at a reverse bias of 10 V. At the same temperatures and reverse bias condition, the empty package had leakage currents of 1.1 pA and 0.2 pA, respectively. When the reverse bias was increased to 15 V in each case, the leakage currents measured with the packaged device and the empty package became indistinguishable at both temperatures. Considering the uncertainties associated with the leakage current measurements, the leakage current from the diode itself can be considered negligible compared with the leakage current from the package.

Figure 12:
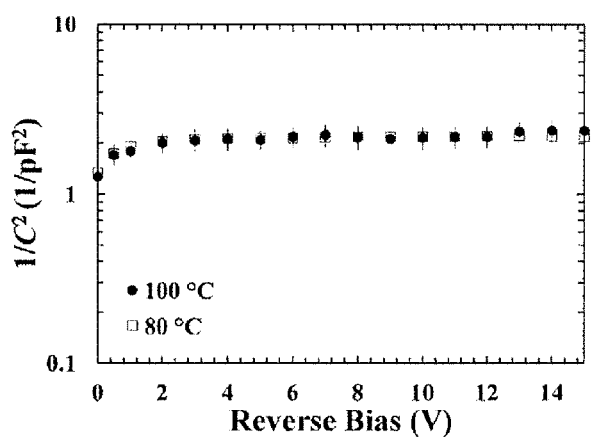
FIG. 12 shows $1/C^2$ as a function of reverse bias at 100° C. and at 80° C.

At different temperatures, the capacitance of the packaged $In_{0.5}Ga_{0.5}P$ detector as a function of reverse bias was measured. The capacitance of an empty package of the same type was also measured at different temperatures and subtracted from the measured capacitance of the packaged $In_{0.5}Ga_{0.5}P$ photodiode. At each temperature, the capacitances were measured multiple times; the mean and its relative standard deviation were considered. In the temperature range studied, the capacitance of the $In_{0.5}Ga_{0.5}P$ detector itself (C) was found to be temperature invariant. $1/C^2$ as a function of reverse bias at 100° C. and at 80° C. is shown in FIG. 12, similar results were found at temperatures ≤60° C. A dependence between $1/C^2$ and the reverse bias was found at reverse biases below 3 V; $1/C^2$ was constant at reverse biases higher than 3 V.

X-ray spectra were obtained using the $^{55}$Fe radioisotope X-ray source. Although temperatures above 100° C. can be used such results are not described herein. At 100° C., the diode was stable throughout the spectrum acquisition time. The diode did not degrade after being used at such temperatures.

An improvement in energy resolution (as quantified by the FWHM at 5.9 keV) was observed when increasing the applied reverse bias from 0 V to 5 V. This result can be explained considering the reduction in capacitance of the detector and possibly improved charge collection. No further change in FWHM was observed when operating the detector at reverse biases>5 V. The latter behaviour can be explained considering that the In$_{0.5}$Ga$_{0.5}$P photodiode is fully depleted above 5 V.

Figure 13:
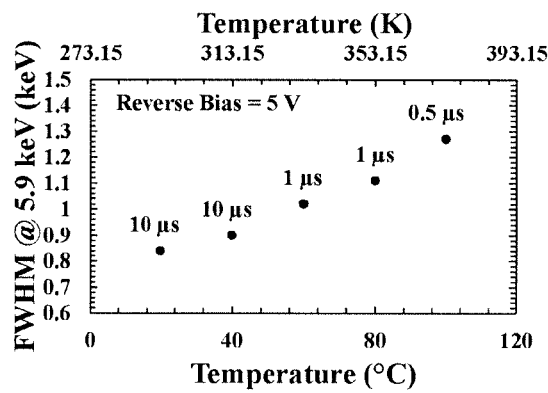
FIG. 13 shows an optimum shaping time varied with temperature.

The optimum shaping time (i.e. that which produced the smallest FWHM) varied with temperature, as shown in FIG. 13. The FWHM decreased at lower temperatures because of the lower leakage currents of the In$_{0.5}$Ga$_{0.5}$P photodiode and Si JFET at such temperatures. FIG. 13 shows the smallest observed FWHM of the 5.9 keV peak as a function of temperature at the optimum shaping time, when the detector was reverse biased at 5 V.

Figure 14:
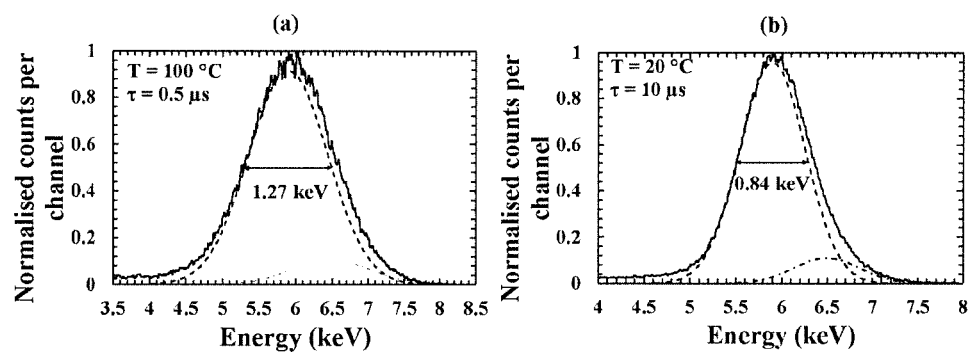
FIGS. 14A and 14B each show a spectra with the best energy resolution (smallest FWHM) at 100° C. and 20° C. with the photodiode reverse biased at 5 V.

The spectra with the best energy resolution (smallest FWHM) at 100° C. and 20° C. with the photodiode reverse biased at 5 V are presented in FIGS. 14A and 14B respectively. Also shown in each spectrum are the deconvolved Mn Kα (dashed line) and Mn Kβ (dashed-dot line) peaks. The observed $^{55}$Fe photopeaks were the combination of the characteristic Mn Kα (5.9 keV) and Mn Kβ (6.49 keV) lines of the $^{55}$Fe radioisotope X-ray source. To determine the FWHM of the 5.9 keV peaks in FIGS. 13 and 14, Gaussian fitting was performed on the photopeaks: the Mn Kα and Mn Kβ peaks were deconvolved from detected combined photopeak. The fitting took into account the relative X-ray emission rates of the radioisotope X-ray source at 5.9 keV and 6.49 keV in the appropriate ratio as well as the relative efficiency of the detector at these X-ray energies.

The energy resolution (FWHM) of a non-avalanche X-ray photodiode spectrometer is degraded by the Fano noise, the charge trapping noise, and the electronic noise. The Fano noise is due to the statistical nature of the ionisation process. At each temperature studied, the observed FWHM was greater than the expected Fano limited energy resolution, indicating that noise sources other than the statistical charge creation process were significant. In a photodiode X-ray spectrometer, the electronic noise is caused by five different components: parallel white noise, series white noise, induced gate current noise, 1/f noise, and dielectric noise. The leakage currents of the detector and the Si input JFET of the preamplifier (which was operated uncooled at each temperature) influenced the parallel white noise. The capacitances of the detector and input JFET of the preamplifier influence the series white and 1/f noises. Parallel white noise and series white noise are, respectively, directly and inversely proportional to the shaping time; whilst 1/f noise and dielectric noise are independent of shaping time.

Figure 15:
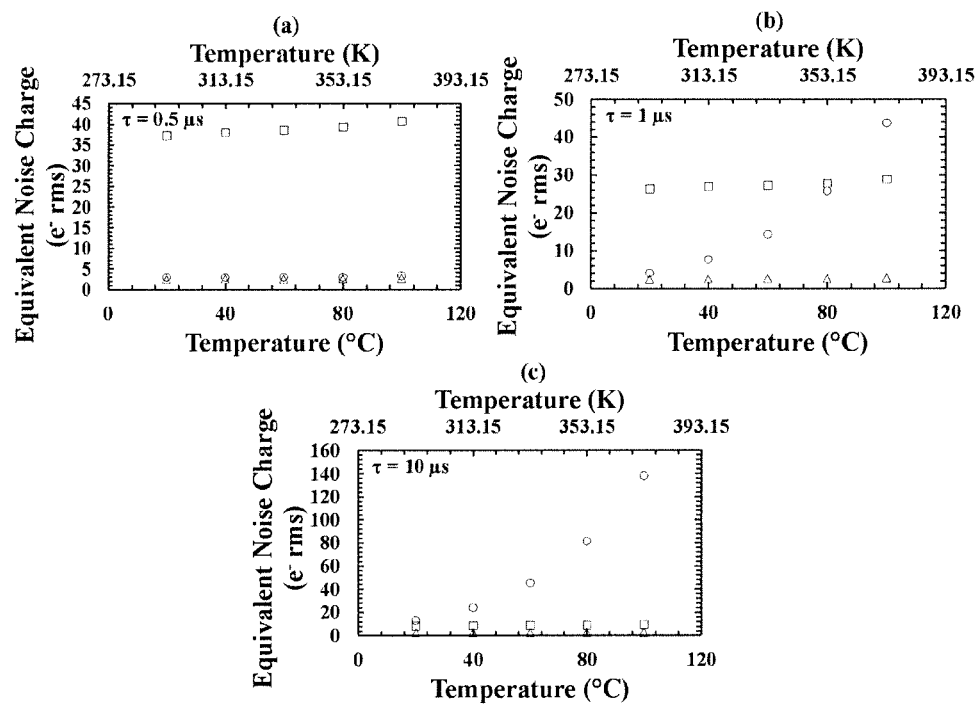
FIGS. 15A, 15B and 15C show a calculated parallel white noise, series white noise, and 1/f noise, respectively.

The calculated parallel white noise, series white noise (adjusted for induced gate current noise, and 1/f noise, at shaping times of 0.5 µs, 1 µs and 10 µs, with the photodiode reverse biased at 5 V, are shown in FIGS. 15A, 15B and 15C respectively. In the graphs the parallel white noise (empty circles), the series white noise (empty squares) and the 1/f noise (empty triangles) contributions are shown. The high parallel white noise observed at increased temperatures and at increased shaping times is not due to the high leakage current of the detector, but instead due to the higher current of the uncooled Si input JFET of the preamplifier.

As discussed above, (1) the FWHM of the photopeak did not reduce at reverse biases>5 V, (2) the photopeak's centroid channel number did not increase as the reverse bias was increased beyond 5 V, and (3) the spectra shown in FIG. 14 are well fitted by the Gaussians without shoulders or other distortions beyond the expected low energy tailing. Thus, it can be assumed that the difference in quadrature between the FWHM at 5.9 keV and the calculated noise contributions (Fano noise, parallel white noise, series white noise, and 1/f noise) can be attributed to the dielectric noise (i.e. under this condition, charge trapping noise was negligible).

Figure 16:
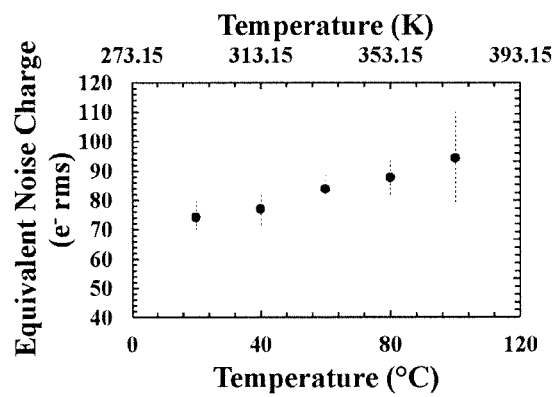
FIG. 16 shows the temperature dependence of the dielectric noise.

The temperature dependence of the dielectric noise is shown in FIG. 16. FIG. 16 shows the equivalent noise charge of the dielectric noise at 5.9 keV as a function temperature, when the photodiode was reverse biased at 5 V. In the temperature range 100° C. to 20° C., the dielectric noise contribution at 5.9 keV linearly decreased with decreasing temperature: at 100° C. a value of 94 e– rms±15 e– rms was calculated; whilst at 20° C. a value of 68 e– rms±7 e– rms was determined. A linear least squares fit was performed on the relationship between the squared dielectric equivalent noise charge and the temperature. From this, the combined dissipation factor related to all the dielectrics in the spectrometer was estimated to be $(8.5\pm0.8)\times10^{-3}$. Comparison of the standard deviations of the fitting with the experimental uncertainties demonstrated that the linear fitting was appropriated, validating the value of the combined dissipation factor calculated.

Figure 17:
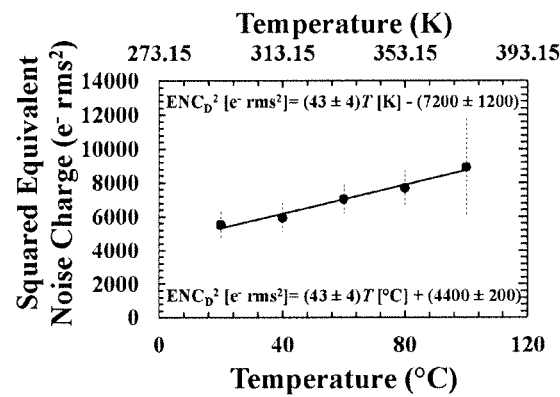
FIG. 17 shows a squared equivalent noise charge (ENCD2) of the dielectric noise at 5.9 keV as a function temperature.

FIG. 17 shows the squared equivalent noise charge (ENCD2) of the dielectric noise at 5.9 keV as a function temperature. Also shown is the line of the best fit computed by linear least squares fitting.

The In$_{0.5}$Ga$_{0.5}$P spectrometer allowed high temperature operation (up to the maximum investigated, 100° C.). It presented better FWHM than was achieved using Al$_{0.52}$In$_{0.48}$P and Al$_{0.8}$Ga$_{0.2}$As spectrometers. The ability to work at such high (100° C.) temperatures together with their greater X-ray attenuation coefficients makes In$_{0.5}$Ga$_{0.5}$P spectrometers preferred over recently reported GaAs spectrometers which have a maximum operating temperature of 60° C. The In$_{0.5}$Ga$_{0.5}$P X-ray spectrometer also performed better at 100° C. than the previously reported Al$_{0.52}$In$_{0.48}$P X-ray spectrometers. The FWHM at 5.9 keV for the In$_{0.5}$Ga$_{0.5}$P device was 1.27 keV at 100° C., c.f. 1.57 keV for the Al$_{0.52}$In$_{0.48P}$ device using similar device readout electronics. In$_{0.5}$Ga$_{0.5}$P also has larger linear attenuation coefficients than Al$_{0.52}$In$_{0.48}$P.

Since the readout electronics used to characterise these materials have been broadly comparable, the difference in obtained FWHM for these materials (GaAs, AlInP, InGaP) can be explained considering their different electron-hole pair creation energies and the noise contributions of the readout electronics at high temperature. A total noise at the input of the preamplifier of 86 e– rms, for example, corresponds to 840 eV in GaAs, to 1.00 keV in In$_{0.5}$Ga$_{0.5}$P and to 1.08 keV in Al$_{0.52}$In$_{0.48}$P. The observed FWHM of 1.02 keV at 5.9 keV at 60° C. for the In$_{0.5}$Ga$_{0.5}$P spectrometer was very close to the expected value. Therefore, the total noise in e– rms was similar in the GaAs and In$_{0.5}$Ga$_{0.5}$P spectrometers, since the preamplifier was limited by noises other than the detector leakage current at these temperatures. It should also be noted that the X-ray attenuation coefficients of In$_{0.5}$Ga$_{0.5}$P are much greater than those for other materials such as SiC. Thus, even if the ultimately achievable energy resolution with In$_{0.5}$Ga$_{0.5}$P is lower than other materials, In$_{0.5}$Ga$_{0.5}$P may still be preferred for low-flux, high-energy applications.

The Fano-limited energy resolution is related to the charge creation process at the absorption of an X-ray photon, and is the statistically limited energy resolution of a non-avalanche X-ray photodiode spectrometer. The Fano-limited energy resolution (FWHM in eV) can be calculated using equation 1 below:

$$FWHM = 2.35\varepsilon\sqrt{\frac{FE}{\Xi}} \quad (1)$$

where ε is the semiconductor electron-hole pair creation energy, F is the Fano factor, and E is the X-ray photon's energy. Different semiconductors have different Fano limited energy resolutions at the same X-ray photon's energy. This is because the Fano limited energy resolution at each energy is dependent on physical material properties (average electron-hole pair creation energy and Fano factor).

For the room temperature (20° C.) electron-hole pair creation energy measurements, the charge created by the absorption of X-rays from the $^{55}$Fe radioisotope X-ray source in the $In_{0.5}Ga_{0.5}P$ photodiode was measured relative to that created in a reference 200 μm GaAs mesa photodiode. The structure of the GaAs device is summarised in Table 4 below. The $In_{0.5}Ga_{0.5}P$ and GaAs detectors were connected in parallel to the custom-made low-noise charge-sensitive preamplifier.

TABLE 4

| Layer | Material | Thickness (μm) | Dopant | Dopant Type | Doping density (cm$^{-3}$) |
|---|---|---|---|---|---|
| 1 | Ti | 0.02 | | | |
| 2 | Au | 0.2 | | | |
| 3 | GaAs | 0.5 | Be | p$^+$ | 2 × 10$^{18}$ |
| 4 | GaAs | 10 | undoped | | <10$^{15}$ |
| 5 | GaAs | 1 | Si | n$^+$ | 2 × 10$^{18}$ |
| 6 | Substrate n$^+$ GaAs | | | | |
| 7 | InGe | 0.02 | | | |
| 8 | Au | 0.2 | | | |

The $In_{0.5}Ga_{0.5}P$ and the GaAs photodetectors were both independently reverse biased at 10 V. Spectra were accumulated with the radioisotope X-ray source illuminating the $In_{0.5}Ga_{0.5}P$ device and the GaAs device separately, in turn. Gaussians were fitted to the detected Mn Kα (5.9 keV) and Mn Kβ (6.49 keV) peaks of the accumulated spectra; the $^{55}$Fe X-ray spectra accumulated and the fitted 5.9 keV peaks for the $In_{0.5}Ga_{0.5}P$ detector and the GaAs reference photodetector are shown in FIG. 18.

Figure 18:
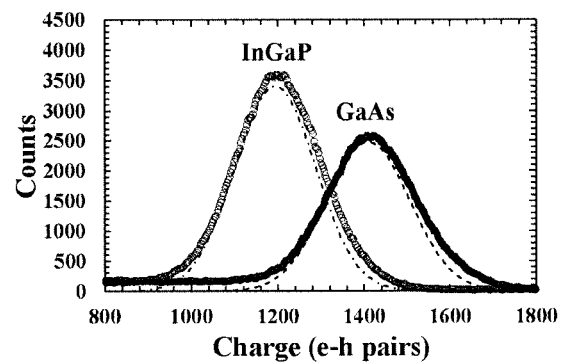
FIG. 18 shows a $^{55}Fe$ X-ray spectra accumulated and the fitted 5.9 keV peaks for a $In_{0.5}Ga_{0.5}P$ detector and a GaAs reference.

FIG. 18 shows the X-ray spectra accumulated at 10 V reverse bias using the $In_{0.5}Ga_{0.5}P$ device and the GaAs reference photodetector under the illumination of $^{55}$Fe radioisotope X-ray source. Also shown are the fitted 5.9 keV lines for the $In_{0.5}Ga_{0.5}P$ device (dashed-dot line) and the GaAs reference photodetector (dashed line). For clarity, the fitted 6.49 keV Mn Kβ peaks are not shown but were included appropriately in the fitting.

The quantity of charge corresponding to each MCA channel was calculated using the position of the zero noise energy peak of the preamplifier and the 5.9 keV peak detected by the GaAs reference photodiode. In this calculation, the GaAs electron-hole pair creation energy (4.184 eV±0.025 eV) was also used. The $In_{0.5}Ga_{0.5}P$ electron-hole pair creation energy (εInGaP) was then determined using equation 2 below:

$$\varepsilon_{InGaP} = \varepsilon_{GaAs}\left(\frac{N_{GaAs}}{N_{InGaP}}\right) \quad (2)$$

where εGaAs is the electron-hole pair creation energy in GaAs, NGaAs and NInGaP are the number of charges created in the GaAs reference detector and $In_{0.5}Ga_{0.5}P$ detector, respectively. An experimental value of 4.94 eV±0.06 eV was measured for εInGaP at room temperature (20° C.). To examine the effect of operating the $In_{0.5}Ga_{0.5}P$ detector at higher reverse biases, the reverse bias was increased to 15 V, and the experiment repeated. An electron-hole pair creation energy of 4.90 eV±0.04 eV was measured in this instance. The similarity of the values further confirms that charge trapping was negligible. If charge trapping was significant, a substantial reduction in apparent electron-hole pair creation energy would have been observed at higher reverse bias as a consequence of the improved charge transport at higher electric field.

The dependence of the $In_{0.5}Ga_{0.5}P$ electron-hole pair creation energy upon temperature was studied across the temperature range 100° C. to 20° C. For this set of measurements, the detector was individually connected to the custom-made low-noise charge-sensitive preamplifier (i.e. without the GaAs reference detector) and illuminated by the $^{55}$Fe radioisotope X-ray source. The change in conversion factor of the preamplifier itself with temperature was measured across the temperature range by connecting a stabilized pulse generator (Berkeley Nucleonics Corporation model BH-1) to the test signal input of the preamplifier. The change in position of the centroid of the pulse generator peak allowed the change in performance of the preamplifier with temperature to be detangled from the change in electron-hole pair creation energy of the photodiode. The change in position of the centroid of the pulse generator peak was appropriately corrected for the change in the test capacitance with temperature. Spectra were collected and Gaussians were fitted to the photopeak and the peak from the pulse generator in order to determine the positions of their centroids with respect to the zero noise peak. The charge created in the $In_{0.5}Ga_{0.5}P$ photodiode by the X-ray photons was related to the relative change in position of the photopeak on the MCA's charge scale. The latter was corrected for the preamplifier's change in conversion factor with temperature (determined from the pulser peak). The different quantities of charge created at different temperatures was caused by the change in the $In_{0.5}Ga_{0.5}P$ electron-hole pair creation energy (εInGaP). At each temperature, the absolute value of εInGaP was then computed using the previously determined room temperature εInGaP.

Figure 19:
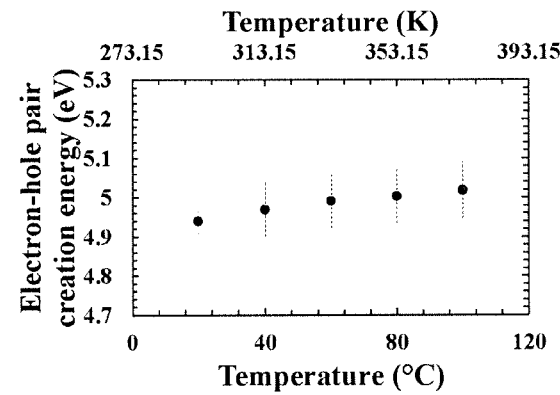
FIG. 19 shows an $In_{0.5}Ga_{0.5}P$ electron-hole pair creation energy as a function of temperature.

The $In_{0.5}Ga_{0.5}P$ electron-hole pair creation energy as a function of temperature is reported in FIG. 19. An apparent slight trend suggesting that the $In_{0.5}Ga_{0.5}P$ electron-hole pair creation energy increased with increasing temperature was found: at 100° C., εInGaP=5.02 eV±0.07 eV, whereas at 20° C. εInGaP=4.94 eV±0.06 eV. Such a trend is surprising. It is conventionally considered that the average electron-hole pair creation energy decreases linearly as the temperature increases. Such a decrease can be understood considering the dependence of the electron-hole pair creation energy on the material bandgap energy. According to previous reports, the empirical relationship between the electron-hole pair creation energy and the bandgap energy in a semiconductor is linear. Since the bandgap increases at decreased temperatures, a similar behaviour is expected for the electron-hole pair creation energy, due at least in part to the change in bandgap. Theoretical Monte Carlo calculations conducted previously for silicon predicted the decrease of the Si electron-hole pair creation energy as a function of temperature. In such a model, physical mechanisms as X-ray absorption, atomic relaxation, and electron energy losses were considered.

The expected Fano limited energy resolution (FWHM) at 5.9 keV of X-ray detectors made from $In_{0.5}Ga_{0.5}P$ can be calculated to be 139 eV at 20° C. This was estimated using equation 1, the determined values for the electron-hole pair creation energy, and assuming a Fano factor of 0.12. A negligible change over the 20° C. to 100° C. temperature range was observed.

The electron-hole pair creation energy obtained at 27° C. (300 K), (4.95 eV±0.03 eV), agreed well with the value predicted for $In_{0.5}Ga_{0.5}P$ by the empirical Bertuccio-Maiocchi-Barnett (BMB) relationship (4.83 eV±0.21 eV).

Figure 20:
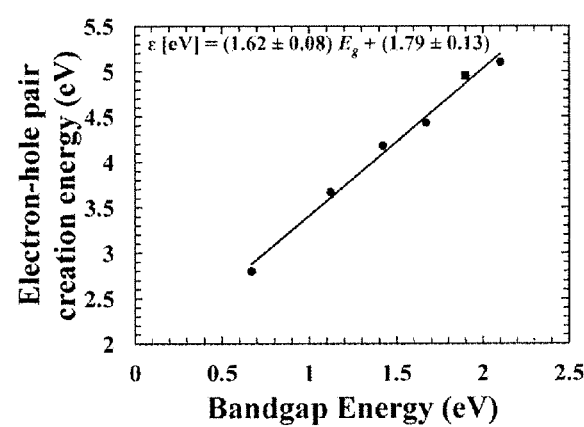
FIG. 20 shows the average electron-hole pair creation energy for Ge, Si, GaAs, $Al_{0.2}Ga_{0.8}As$, $Al_{0.8}Ga_{0.2}As$ (filled circles), and $In_{0.5}Ga_{0.5}P$ (filled square), and as a function of their respective bandgap energies, at a temperature of 300 K.

FIG. 20 shows the average electron-hole pair creation energy for Ge, Si, GaAs, $Al_{0.2}Ga_{0.8}As$, $Al_{0.8}Ga_{0.2}As$ (filled circles), and $In_{0.5}Ga_{0.5}P$ (filled square), and as a function of their respective bandgap energies, at a temperature of 300 K.

A linear least squares fit of the data showed that the previously reported BMB dependence between electron-hole pair creation energy and bandgap energy can be refined using the new data for $In_{0.5}Ga_{0.5}P$. The new relation is $\varepsilon = AE_g + B$ with $A = (1.62\pm0.08)$ and $B = (1.79\pm0.13)$ eV.

For the first time, the inventors have demonstrated the use of an X-ray spectrometer with an InGaP detector across the temperature range 100° C. to 20° C. The spectrometer was characterised at different shaping times and detector reverse biases. The best energy resolution (smallest FWHM) at 5.9 keV was 1.27 keV at 100° C. using a shaping time of 0.5 μs, and this improved to 840 eV at 20° C. (using a shaping time of 10 μs), when the InGaP detector was reverse biased at 5 V. An improvement in energy resolution (as quantified by the FWHM at 5.9 keV) was observed when increasing the applied reverse bias from 0 V to 5 V. The better results obtained at 5 V can be explained considering the improved charge collection in the greater electric field strength. Similar FWHM to that measured at 5 V were observed at 10 V and 15 V, suggesting that charge trapping noise at 5 V and above was negligible. System noise analysis showed that the observed FWHM were higher than the likely statistically limited energy resolution (i.e. the Fano-limited energy resolution). The parallel white noise, series white noise, 1/f noise, and dielectric noise were calculated. The higher parallel white noise observed at increased temperatures was caused by the Si input JFET of the preamplifier rather than the photodetector.

Although circular photodiodes (as viewed from the top down) have been discussed herein, other geometries of photodiodes are contemplated. Circular devices may be preferred for use in single pixel detectors because their top face area to side wall area ratio is maximised. For a pixel array detectors comprising a plurality of such photodiodes arranged in a 1D or 2D array, circular or other shaped devices may be desired. For example, it may be desired to use devices that have tessellating shapes, such as square or polygon devices.

Various embodiments have been described in which the photodiode is used in spectroscopy, or to determine the source and/or location of X-ray and/or gamma-ray sources. However, it is contemplated that the photodiode may be used in other instruments. For example, the photodiode may be used in a radioisotope microbattery (also known as a nuclear microbattery).

Nuclear microbatteries comprise a radioactive source for emitting radioactive particles (i.e. alpha or beta particles) or photons, and a detector that receives those particles or photons and converts them into an electrical current. Such devices are desirable as they have a relatively long life span (e.g. >10 year), high energy density and small size. Such devices may be used in applications such as microelectromechanical systems (MEMS), implantable medical devices, and military equipment. It is desirable for nuclear microbatteries to be usable under extreme conditions (including hot and cold temperatures, extreme pressures, mechanical shocks and vibration) as they may be required for specialist applications, e.g. in aeronautics, astronautics, deep ocean exploration, and instrumentation for hot and cold environments such as deserts.

The effect of operating temperature on microbattery photovoltaic cell performance is of importance for many target applications, as temperature can significantly affect the voltaic cell's performance.

The inventors have recognised that a photodiode comprising InGaP is particularly useful in a nuclear microbattery because, as described above, InGaP, is surprising efficient at converting X-rays and gamma-rays into electrical charge carriers. Also, the use of InGaP enables the microbattery to be operated in a relatively wide range of temperatures and under high doses of radiation with relatively low loss of performance. These characteristics, coupled to the relatively high conversion efficiency and the relatively low production costs (e.g. it can be grown on commercial GaAs substrates using common growth methods), make InGaP particularly suitable for use in X-ray and/or gamma-ray nuclear microbatteries.

It has also been recognised that the use of a nuclear micro-battery comprising a radioisotope X-ray source reduces the risk associated with device damage, as compared to radioisotope beta particle sources for example, because soft X-ray sources (e.g. photon energies<10 keV) can be shielded relatively easily do as to provide safe conditions.

An exemplary embodiment of a nuclear microbattery will now be described, by way of example only, to assist in the understanding of the invention. It will be appreciated that the invention is not limited to including all of the layers described, or the specific composition of the various layers in this example.

A microbattery was formed comprising the 400 μm diameter mesa photodiode described in relation to Table 1 above and a 206 MBq $^{55}$Fe radioisotope X-ray source (Mn Kα=5.9 keV, Mn Kβ=6.49 keV) for illuminating the photodiode. The X-ray source was positioned 5 mm away from top surface of the detector (i.e. with the PIN structure between the X-ray source and the substrate (layer 7 in Table 1).

The microbattery was placed inside a TAS Micro MT climatic cabinet with a dry nitrogen atmosphere (relative humidity<5%). Current characteristics as function of applied forward bias (from 0 V to 1 V in 0.01 V increments) were measured using a Keithley 6487 picoammeter/voltage source over the temperature range −20° C. to 100° C.

Figure 9:
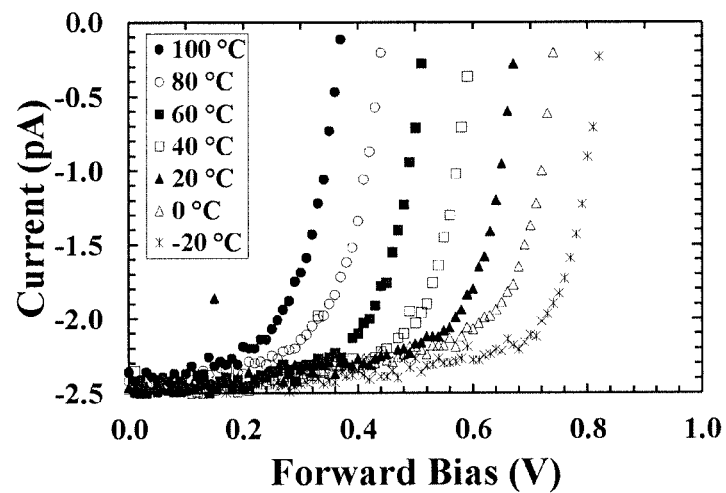
FIG. 9 shows an electrical current generated by a microbattery as a function of forward bias across a photodiode for various different temperature conditions.

FIG. 9 shows the electrical current generated by the microbattery as a function of forward bias across the photodiode for various different temperature conditions.

Figure 21:
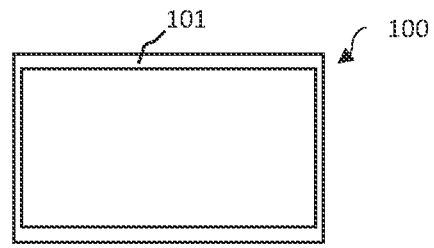
FIG. 21 shows a diode and a housing.
Figure 22:
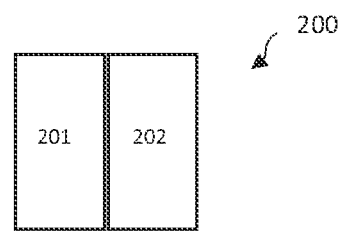
FIG. 22 shows a p-n junction including a p-doped layer of InGaP and an n-doped layer of InGaP.
Figure 23:
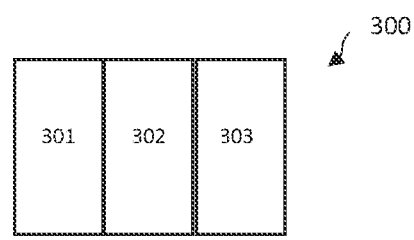
FIG. 23 shows a PIN junction including a p-doped layer of InGaP, an undoped layer of InGaP and an n-doped layer of InGaP.
Figure 24:
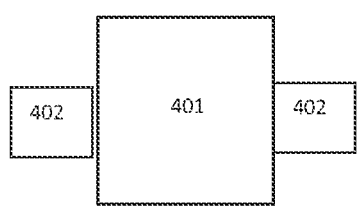
FIG. 24 shows electrodes on either side of a PIN or a p-n junction.
Figure 25:
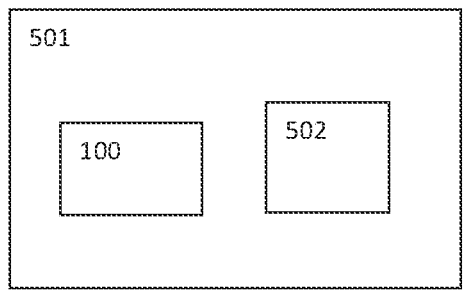
FIG. 25 shows a detector comprising diode and electronics.
Figure 26:
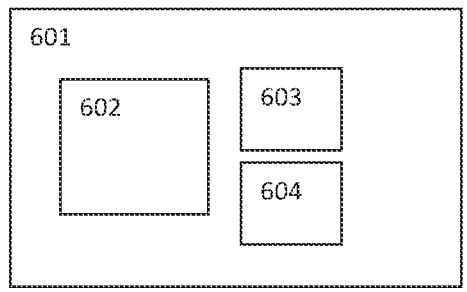
FIG. 26 shows a photon counting spectrometer comprising a detector; electronics and a processor.
Figure 27:
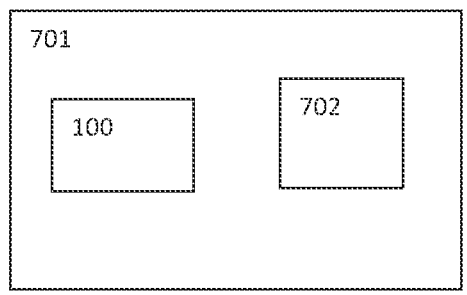
FIG. 27 shows a system/battery, a diode and a source.
Figure 28:
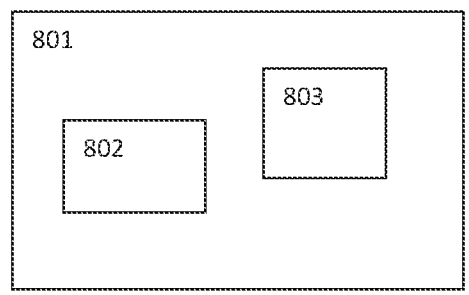
FIG. 28 shows a photon or particle detecting instrument comprising diode and electronics.
Figure 29:
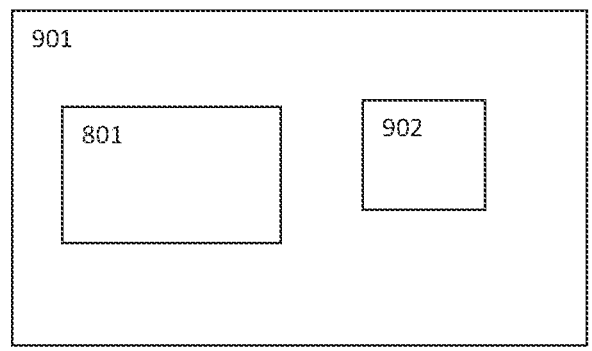
FIG. 29 shows a spectrometer comprising a particle detecting instrument and a processor.

FIG. 21 shows a photodiode 100 for use in detecting X-rays and/or gamma rays, the photodiode comprising InGaP configured to adsorb X-rays and/or gamma rays and generate charge-carriers and a housing or shield 101 configured to block photons other than X-rays and/or gamma rays and to block radioactive beta and/or alpha particles. FIG. 22 shows a p-n junction 200 including p-doped layer of InGaP 201 and an n-doped layer of InGaP 202. FIG. 23 shows a PIN junction 300 including a p-doped layer of InGaP 301 having a thickness, an i-layer or an undoped layer of InGaP 302 having a thickness and an n-doped layer of InGaP 303 having a thickness. FIG. 24 shows electrodes 402 on either side of a PIN or a p-n junction 401. At least one of the electrodes 402 does not cover a portion of the side such that X-rays and/or gamma rays can pass. FIG. 25 shows a detector 501 comprising diode 100 and electronics 502. The electronics 502 is for processing an electrical signal generated by the photodiode 100 to determine if the signal is due to the generation of the photo generated charge-carriers. FIG. 26 shows a photon counting spectrometer 601 comprising a detector 602, electronics 603 and a processor 604. FIG. 27 shows a nuclear or radioisotope system/battery 701 including a diode 100 and a source of X-rays and/or gamma rays 702. FIG. 28 shows a photon or particle detecting instrument 801 comprising a diode 802 and electronics 803. FIG. 29 shows an X-ray and/or gamma-ray photon counting spectrometer 901 comprising a particle detecting instrument 801 or detector comprising the photodiode and a processor 902 set up and configured to determine the energies of individual X-rays and/or gamma-ray photons to determine the number of X-ray and/or gamma ray photons detected.

Although the present invention has been described with reference to preferred embodiments, it will be understood by those skilled in the art that various changes in form and detail may be made without departing from the scope of the invention as set forth in the accompanying claims.

The invention claimed is:

1. A photodiode for use in detecting X-rays and/or gamma rays, the photodiode comprising InGaP which is arranged and configured to absorb X-rays and/or gamma-rays incident on the photodiode and generate charge-carriers in response thereto; and:
 a PIN junction formed by an undoped layer of InGaP arranged directly between a p-doped layer of InGaP and an n-doped layer of InGaP, or
 a p-n junction formed by a p-doped layer of InGaP contacting an n-doped layer of InGaP.

2. The photodiode of claim 1, comprising a housing or shield arranged and configured to block photons other than X-rays and/or gamma-rays from reaching the InGaP, and/or arranged and configured to block radioactive beta and/or alpha particles from reaching the InGaP.

3. The photodiode of claim 1, wherein the photodiode comprises the PIN junction and the i-layer of the PIN junction has a thickness of: ≥5 µm, ≥10 µm, ≥15 µm, ≥20 µm, ≥25 µm, ≥30 µm, ≥35 µm, ≥40 µm, ≥45 µm, or ≥50 µm.

4. The photodiode of claim 3, wherein the p-layer and/or n-layer of the PIN junction has a thickness of: ≤0.5 µm, ≤0.4 µm, ≤0.3 µm, ≤0.2 µm, or ≤0.1 µm.

5. The photodiode of claim 1, comprising an electrode on either side of the PIN junction or p-n junction for applying a voltage across the junction and/or for measuring the photo-generated charge-carriers generated in the junction, wherein at least one of the electrodes does not cover a portion of the side of the junction on which it is located such that X-rays and/or gamma-rays can pass into the junction through said side without passing through said at least one electrode.

6. The photodiode of claim 1, wherein the InGaP is a crystalline structure having a lattice composition $In_{0.5}Ga_{0.5}P$.

7. An X-ray and/or gamma-ray detector comprising the photodiode of claim 1, and comprising electronics for processing an electrical signal generated by the photodiode to determine if said electrical signal is due, at least in part, to the generation of said photo-generated charge-carriers.

8. A method of detecting X-rays and/or gamma-rays comprising:
 exposing the X-ray and/or gamma-ray detector of claim 7 to a source of X-rays and/or gamma-rays; and
 determining from the signal generated by the photodiode that X-rays and/or gamma-rays have been received at the detector.

9. The method of claim 8, further comprising detecting the presence and/or location of said source of X-rays and/or gamma-rays using the detector.

10. An X-ray and/or gamma-ray photon counting spectrometer comprising:
 a detector comprising the photodiode of claim 1, and comprising electronics for processing an electrical signal generated by the photodiode to determine if said electrical signal is due, at least in part, to the generation of said photo-generated charge-carriers; and
 a processor set up and configured to determine the energies of individual X-ray and/or gamma-ray photons detected by the detector from said electrical signal and/or to determine the number of X-ray and/or gamma-ray photons detected by the detector from said signal.

11. A method of counting X-ray and/or gamma-ray photons comprising:
 exposing the X-ray and/or gamma-ray spectrometer of claim 10 to a source of X-rays and/or gamma-rays; and
 determining, from the electrical signal generated by the photodiode, the energies of individual X-ray and/or gamma-ray photons detected by the detector from said electrical signal and/or determining the number of X-ray and/or gamma-ray photons that have been detected at the detector.

12. The photodiode of claim 1, further comprising, in combination, a system comprising a source of X-rays and/or gamma-rays, wherein the photodiode is configured to detect the X-rays and/or gamma-rays from said source.

13. The photodiode and system of claim 12, wherein the system is a nuclear or radioisotope battery comprising said source of X-rays and/or gamma-rays and said photodiode for converting said X-rays and/or gamma-rays into an electrical current.

14. The photodiode and system of claim 13, wherein said source is radioactive material.

15. A photon or particle detecting instrument comprising:
 a diode comprising InGaP which is arranged and configured to absorb and/or interact with said photons or particles and generate charge-carriers in response thereto; and
 electronics for processing an electrical signal generated by the diode to determine if said electrical signal is due, at least in part, to the generation of said charge-carriers; wherein the diode further comprises:
 a PIN junction formed by an undoped layer of InGaP arranged directly between a p-doped layer of InGaP and an n-doped layer of InGaP; or
 a p-n junction formed by a p-doped layer of InGaP contacting an n-doped layer of InGaP.

16. A photon or particle counting spectrometer comprising the instrument of claim 15, and comprising a processor set up and configured to determine the energies of individual photons or particles detected by the instrument from said electrical signal and/or to determine the number of photons or particles detected by the instrument from said signal.

17. A method of counting photons or particles comprising:
 exposing the spectrometer of claim 16 to a source of photons or particles; and
 determining, from the electrical signal generated by the diode, the energies of individual photons or particles detected by the instrument from said electrical signal and/or determining the number of photons or particles that have been detected at the instrument.

18. A system comprising a source of photons or particles and an instrument according to claim 15, for detecting the photons or particles from said source.

19. A method of detecting photons or particles comprising:
   exposing the instrument of claim 15 to a source of said photons or particles; and
   determining from the signal generated by the diode that photons or particles have been received at the instrument.

* * * * *